(12) United States Patent
Foletto et al.

(10) Patent No.: US 8,749,005 B1
(45) Date of Patent: Jun. 10, 2014

(54) MAGNETIC FIELD SENSOR AND METHOD OF FABRICATING A MAGNETIC FIELD SENSOR HAVING A PLURALITY OF VERTICAL HALL ELEMENTS ARRANGED IN AT LEAST A PORTION OF A POLYGONAL SHAPE

(71) Applicants: Andrea Foletto, Annecy (FR); Andreas P. Friedrich, Metz-Tessy (FR); Nicolas Yoakim, Annecy (FR)

(72) Inventors: Andrea Foletto, Annecy (FR); Andreas P. Friedrich, Metz-Tessy (FR); Nicolas Yoakim, Annecy (FR)

(73) Assignee: Allegro Microsystems, LLC, Worcester, MA (US)

( * ) Notice: Subject to any disclaimer, the term of this patent is extended or adjusted under 35 U.S.C. 154(b) by 0 days.

(21) Appl. No.: 13/724,170

(22) Filed: Dec. 21, 2012

(51) Int. Cl.
*H01L 29/82* (2006.01)
*H01L 43/06* (2006.01)
*G01R 33/07* (2006.01)

(52) U.S. Cl.
CPC .............. *H01L 43/06* (2013.01); *H01L 43/065* (2013.01); *G01R 33/077* (2013.01)
USPC ..................... 257/427; 324/207.2; 324/207.25

(58) Field of Classification Search
CPC ..... H01L 43/06; H01L 43/065; G01R 33/077
USPC ............................ 257/427; 324/207.2, 207.25
See application file for complete search history.

(56) References Cited

U.S. PATENT DOCUMENTS

| | | |
|---|---|---|
| 4,668,914 A | 5/1987 | Kersten et al. |
| 4,761,569 A | 8/1988 | Higgs |
| 4,829,352 A | 5/1989 | Popovic et al. |
| 5,541,506 A | 7/1996 | Kawakita et al. |
| 5,572,058 A | 11/1996 | Biard |
| 5,612,618 A | 3/1997 | Arakawa |
| 5,619,137 A | 4/1997 | Vig et al. |
| 5,621,319 A | 4/1997 | Bilotti et al. |
| 5,657,189 A | 8/1997 | Sandhu |
| 5,694,038 A | 12/1997 | Moody et al. |
| 5,831,513 A | 11/1998 | Lue |
| 5,844,411 A | 12/1998 | Vogt |
| 5,942,895 A | 8/1999 | Popovic et al. |

(Continued)

FOREIGN PATENT DOCUMENTS

DE             198 57 275 A1    6/2000
DE     10 2005 014 509 B4   10/2006

(Continued)

OTHER PUBLICATIONS

Drijaca, et al.; "Nonlinear Effects in Magnetic Angular Position Sensor With Integrated Flux Concentrator;" Proc. $23^{rd}$ International Conference on Microelectronics (MIEL 2002); vol. 1; NIS; Yugoslavia; May 12-15, 2002; pp. 223-226.

(Continued)

*Primary Examiner* — Tu-Tu Ho
(74) *Attorney, Agent, or Firm* — Daly, Crowley, Mofford & Durkee, LLP

(57) ABSTRACT

A magnetic field sensor has a plurality of vertical Hall elements arranged in at least a portion of a polygonal shape. The magnetic field sensor includes an electronic circuit to process signals generated by the plurality of vertical Hall elements to identify a direction of a magnetic field. A corresponding method of fabricating the magnetic field sensor is also described.

39 Claims, 9 Drawing Sheets

(56) References Cited

U.S. PATENT DOCUMENTS

| | | | |
|---|---|---|---|
| 6,064,199 | A | 5/2000 | Walter et al. |
| 6,064,202 | A | 5/2000 | Steiner et al. |
| 6,091,239 | A | 7/2000 | Vig et al. |
| 6,100,680 | A | 8/2000 | Vig et al. |
| 6,166,535 | A | 12/2000 | Irle et al. |
| 6,232,768 | B1 | 5/2001 | Moody et al. |
| 6,236,199 | B1 | 5/2001 | Irle et al. |
| 6,265,864 | B1 | 7/2001 | De Winter et al. |
| 6,288,533 | B1 | 9/2001 | Haeberli et al. |
| 6,297,627 | B1 | 10/2001 | Towne et al. |
| 6,356,741 | B1 | 3/2002 | Bilotti et al. |
| 6,525,531 | B2 | 2/2003 | Forrest et al. |
| 6,542,068 | B1 | 4/2003 | Drapp et al. |
| 6,545,462 | B2 | 4/2003 | Schott et al. |
| 6,622,012 | B2 | 9/2003 | Bilotti et al. |
| 6,768,301 | B1 | 7/2004 | Hohe et al. |
| 6,969,988 | B2 | 11/2005 | Kakuta et al. |
| 7,030,606 | B2 | 4/2006 | Kato et al. |
| 7,038,448 | B2 | 5/2006 | Schott et al. |
| 7,085,119 | B2 | 8/2006 | Bilotti et al. |
| 7,119,538 | B2 | 10/2006 | Blossfeld |
| 7,159,556 | B2 | 1/2007 | Yoshihara |
| 7,235,968 | B2 | 6/2007 | Popovic et al. |
| 7,259,556 | B2 | 8/2007 | Popovic et al. |
| 7,307,824 | B2 | 12/2007 | Bilotti et al. |
| 7,362,094 | B2 | 4/2008 | Voisine et al. |
| 7,714,570 | B2 | 5/2010 | Thomas et al. |
| 7,746,065 | B2 | 6/2010 | Pastre et al. |
| 7,872,322 | B2 | 1/2011 | Schott et al. |
| 7,911,203 | B2 | 3/2011 | Thomas et al. |
| 7,965,076 | B2 | 6/2011 | Schott |
| 7,994,774 | B2 | 8/2011 | Thomas et al. |
| 2005/0230770 | A1 | 10/2005 | Oohira |
| 2006/0011999 | A1 | 1/2006 | Schott et al. |
| 2009/0121707 | A1 | 5/2009 | Schott |
| 2009/0174395 | A1 | 7/2009 | Thomas et al. |
| 2009/0322325 | A1* | 12/2009 | Ausserlechner ............... 324/260 |
| 2010/0156397 | A1 | 6/2010 | Yabusaki et al. |
| 2010/0164491 | A1 | 7/2010 | Kejik et al. |
| 2011/0248708 | A1 | 10/2011 | Thomas et al. |

FOREIGN PATENT DOCUMENTS

| | | |
|---|---|---|
| DE | 10 2006 037 226 A1 | 2/2008 |
| DE | 10 2011 017 096 A1 | 10/2012 |
| EP | 0 631 416 B1 | 12/1994 |
| EP | 0 875 733 B1 | 11/1998 |
| EP | 0 916 074 B1 | 5/1999 |
| EP | 2 000 814 A2 | 12/2008 |
| JP | 58-055688 A | 4/1983 |
| JP | 2003-042709 | 2/2003 |
| JP | 2005-241269 | 9/2005 |
| JP | 2010-014607 | 1/2010 |
| JP | 2010-078366 | 4/2010 |
| WO | WO 98/10302 | 3/1998 |
| WO | WO 98/54547 | 12/1998 |
| WO | WO 00/02266 | 1/2000 |
| WO | WO 03/036732 A2 | 5/2003 |
| WO | WO 2004/025742 A1 | 3/2004 |
| WO | WO 2006/056289 A1 | 6/2006 |
| WO | WO 2006/074989 A2 | 7/2006 |
| WO | WO 2008 145662 A1 | 12/2008 |
| WO | WO 2009/124969 A1 | 10/2009 |

OTHER PUBLICATIONS

Petrie; "Circular Vertical Hall Magnetic Field Sensing Element and Method with a Plurality of Continuous Output Signals;" U.S. Appl. No. 13/035,243, filed Feb. 25, 2011; 56 pages.

Allegro Microsystems, Inc.; "High Precision Linear Hall Effect Sensor IC with a Push/Pull, Pulse Width Modulated Output;" A1351; pp. 1-23, (2008).

Allegro Microsystems, Inc.; "High Precision 2-Wire Linear Hall Effect Sensor IC with a Pulse Width Modulated Output;" A1354; pp. 1-22, (2009).

Allegro Microsystems, Inc.; "High Precision Linear Hall-Effect Sensor with an Open Drain Pulse Width Modulated Output;" A1356; pp. 1-20, (2010).

Allegro Microsystems, Inc.; "Low-Noise Programmable Linear Hall Effect Sensor ICs with Adjustable Bandwidth (50 kHz Maximum) and Analog Output;" A1360, A1361 and A1362; pp. 1-25.

Baschirotto et al.; "Development and Analysis of a PCB Vector 2-D Magnetic Field Sensor System for Electronic Compasses," IEEE Sensors Journal, vol. 6, No. 2; Apr. 2006; pp. 365-371.

Kejik, et al.; "Purley CMOS Angular Position Sensor Based on a New Hall Microchip;" 34th Annual Conference of IEEE Industrial Electronics; IECON; Nov. 10-13, 2008; pp. 1777-1781.

Kejik,.et al.; "Ultra Low-Power Angular Position Sensor for High-Speed Portable Applications;" 2009 IEEE Sensors Conference; Oct. 25-28, 20009; pp. 173-176.

Reymond, et al.; "True 2D CMOS Integrated Hall Sensor;" 2007 IEEE Sensors Conference; Oct. 28-31, 2007; pp. 860-863.

Gerhauser; "Intelligente 3D-Magnetfeld Snesorik;" Fraunhofer-Institut for Integrierte Schaltungen IIS; www.iis.fraunhofer.de/asic/analog; Oct. 2009; 2 pages.

Melexis Microelectronic Integrated Systems; MLX90333; "Triaxis 3D-Joystick Position Sensor;" Data Sheet; Mar. 2009; 43 pages.

MEMSIC Corporation; AN-00MM-004; "Electronic Tilt Compensation;" Mar. 2008; 5 pages.

MEMSiC Corporation; AN-00MM-003; "Magnetic Sensor Calibration;" Mar. 2008; 5 pages.

MEMSIC Corporation; AN-00MM-002; "Magnetometer Soldering Methodology;" Jun. 2008; 2 pages.

MEMSIC Corporation; AN-00MM-001; "Magnetometer Fundamentals;" Jun. 2008; 6 pages.

MEMSIC Corporation; AN-00MM-005; "Magnetic Sensor Placement Guidelines;" Oct. 2008; 2 pages.

MEMSIC Corporation; MMC312xMQ; "Tri-axis Magnetic Sensor, with I$^2$C Interface;" Aug. 14, 2008; 9 pages.

MEMSIC Corporation; MMC314xMS; "Ultra Small 3-axis Magnetic Sensor, with I$^2$C Interface;" Mar. 31, 2010; 8 pages.

Micronas GmbH; "HAL® 3625 Programmable Direct Angle Sensor;" Product Information; Sep. 2009; 2 pages.

Melexis MLX 90324; ""Under-the-Hood" Triaxis Rotary Position feat. SENT Protocol;" 3901090324 Data Sheet; Dec. 2008; 40 pages.

Allegro Microsystems, Inc.; "A1140/41/42/43 Data Sheet: Sensitive Two-Wire Chopper-Stabilized Unipolar Hall-Effect Switches;" published Sep. 9, 2004; pp. 1-11.

Allegro Microsystems, Inc.; "A1174 Data Sheet: Ultrasensitive Hall Effect Latch with Internally or Externally Controlled Sample and Sleep Periods for Track Ball and Scroll Wheel Applications;" published Jul. 25, 2008; pp. 1-13.

Allegro Microsystems, Inc.; "A1230 Data Sheet: Ultra-Sensitive Dual-Channel Quadrature Hall-Effect Bipolar Switch;" published Mar. 26, 2010; 16 sheets.

Allegro Microsystems, Inc.; "A1351 Data Sheet: High Precision Linear Hall Effect Sensor with a Push/Pull, Pulse Width Modulated Output;" published Mar. 7, 2008; pp. 1-23.

Allegro Microsystems, Inc.; "A1360, A1361 and A1362 Data Sheet: Low-Noise Programmable Linear Hall Effect Sensors with Adjustable Bandwidth (50 kHz Maximum) and Analog Output;" published Mar. 18, 2008; pp. 1-25.

Allegro Microsystems, Inc.; "A3212 Data Sheet: Micropower, Ultra-Sensitive Hall-Effect Switch;" published Sep. 22, 2004; pp. 1-12.

Allegro Microsystems, Inc.; "ATS675LSE Data Sheet: Self-Calibrating TPOS Speed Sensor Optimized for Automotive Cam Sensing Applications," published Jul. 11, 2008; pp. 1-13.

Allegro Microsystems, Inc.; "27701-AN Data Sheet: Hall-Effect IC Applications Guide;" Application Information, Rev. 2; http://www.allegromicro.com/en/products/design/hall-effect-sensor-ic-applications-guide/AN27701.pdf; downloaded Sep. 29, 2010; pp. 1-40.

Allegro Microsystems, Inc.; "3235 Data Sheet 27633A, Dual-Output Hall-Effect Switch;" http://www.datasheetcatalog.org/datasheets/90/205047_DS.pdf; downloaded Sep. 29, 2010; 6 sheets.

Allegro Microsystems, Inc.; "A3425 Data Sheet: Dual, Chopper-Stabilized, Ultra-Sensitive Bipolar Hall-Effect Switch;" published Jun. 28, 2002; pp. 1-10.

(56) References Cited

OTHER PUBLICATIONS

Atherton et al.; "Sensor Signal Conditioning—an IC Designer's Perspective;" IEEE Electro International; Apr. 26-28, 1991; pp. 129-134.

Austria Microsystems; "AS5040 datasheet; 10-Bit Programmable Magnetic Rotary Encoder;" Revision 1.1; Jan. 2004; pp. 1-20.

Banjevic et al; "2D CMOS Integrated Magnetometer Based on the Miniaturized Circular Vertical Hall Device;" International Solid-State Sensors, Actuators and Microsystems Conference; Transducers; Jun. 21-25, 2009; pp. 877-880.

Blanchard et al.; "Cylindrical Hall Device;" International Electron Devices Meeting; Dec. 8-11, 1996; pp. 541-544.

Burger et al.; "New fully integrated 3-D silicon Hall sensor for precise angular-position measurements;" Sensors and Actuators, A 67; May 1998; pp. 72-76.

Dwyer; "Allegro Microsystems, Inc.; AN296061 Data Sheet: Ring Magnet Speed Sensing for Electronic Power Steering;" published Jul. 21, 2009; pp. 1-4.

Freitas et al.; "Giant Magnetoresistive sensors for rotational speed control;" Jorunal of Applied Physics, vol. 85, No. 8; Apr. 15, 1999; pp. 5459-5461.

Gilbert; "Technical Advances in Hall-Effect Sensing;" Allegro Microsystems, Inc. Product Description; May 10, 2008; 7 sheets.

Häberli et al.; "Contactless Angle Measurements by CMOS Magnetic Sensor with On Chip Read-Out Circuit;" The $8^{th}$ International Conference on Solid-State Sensors and Actuators and Eurosensors IX; Jan. 25-29, 1995; pp. 134-137.

Häberli et al.; "Two-Dimensional Magnetic Microsensor with On-Chip Signal Processing for Contactless Angle Measurement;" IEEE Journal of Solid-State Circuits, vol. 31, No. 12; Dec. 1996; pp. 1902-1907.

Hiligsmann et al.; "Monolithic 360 Degrees Rotary Position Sensor IC;" 2004 IEEE Proceedings of Sensors, vol. 3; Oct. 24-27, 2004; pp. 1137-1142.

Kejik et al.; "Circular Hall Transducer for Angular Position Sensing;" International Solid-State Sensors, Actuators and Microsystems Conference; Transducers; Jun. 2007; pp. 2593-2596.

Lou Law; "Angle Position Sensing with 2-Axis Hall ICs;" Sensors Magazine, vol. 20, No. 3; Mar. 2003; 7 sheets.

Masson et al.; "Multiturn and high precision through-shaft magnetic sensors;" sensor + Text Conference; Proceedings II; May 2009; pp. 41-46.

Metz et al.; "Contactless Angle Measurement Using Four Hall Devices on Single Chip;"; International Conference on Solid State Sensors and Actuators; Transducers; vol. 1; Jun. 16-19, 1997; pp. 385-388.

Munter; "A Low-offset Spinning-current Hall Plate;" Sensors and Actuators, vol. A21-A23; Jan. 1990; pp. 743-746.

Novotechnik Siedle Group; "How New Angular Posiitioning Sensor Technology Opens a Broad Range of New Applications;" Vert-X Technology; Dec. 2001; pp. 1-5.

Paranjape et al.; "A CMOS-compatible 2-D vertical Hall magnetic-field sensor using active carrier confinement and post-process micromachining;" The $8^{th}$ International Conference on Solid-State Sensors and Acutators, Physical vol. 53, Issues 1-3; May 1996; pp. 278-283.

Petoussis et al.; "A Novel Hall Effect Sensor Using Elaborate Offset Cancellation Method;" Sensors & Transducers Journal, vol. 100, Issue 1; Jan. 2009; pp. 85-91.

Popovic; "Not-plate-like Hall Magnetic sensors and their applications;" Sensors and Actuators A: Physical, vol. 85, Issues 1-3; Aug. 2000; pp. 9-17.

Roumenin et al.; "Vertical Hall Effect Devices in the Basis of Smart Silicon Sensors;" IEEE Workshop on Intelligent Data Acquisition and Advanced Computing Systems: Technology and Applications; Sep. 5-7, 2005; pp. 55-58.

Roumenin; "Magnetic sensors continue to advance towards perfection;" Sensors and Actuators A: Physical, vol. 46-47, Issues 1-3; Jan.-Feb. 1995; pp. 273-279.

Schneider et al.; "Temperature Calibration of CMOS Magnetic Vetor Probe for Contactless Angle Measurement System;" International Electron Devices Meeting; Dec. 8-11, 1996; pp. 533-536.

SENSIMA technology sa; "CVHD: a new concept of Angular Position Sensor," Slide Presentation for Allegro Microsystems; Mar. 2009; 17 sheets.

Sentron; AN-101; "Angular position sensing with 2-Axis Hall IC 2SA-10;" Feb. 12, 2004; http://www.diegm.uniud.it/petrella/Azionamenti%20Elettrici%20ll/Sensori%20e%20transduttori/Data%20Sheet%20-%202SA-10.pdf; pp. 1-7.

van der Meer; et al; "CMOS quad spinning-current Hall-sensor system to compass application;" IEEE Proceedings of Sensors, vol. 3; Oct. 24-27, 2004; pp. 1434-1437.

Vogelgesang et al.; Robert Bosch GmbH; "GMR sensors in automotive application;" CS-SNS/ECS Slides Presentation; Mar. 2, 2005; 16 sheets.

Volder; "The CORDIC Trigonometric Computing Technique;" The Institute of Radio Engineers, Inc.; IRE Transactions on Electronic Computers, vol. EC, Issue 3; Sep. 1959; pp. 226-230.

PCT Invitation to Pay Additional Fees and Partial Search Report dated Mar. 26, 2014; for PCT Pat. App. No. PCT/US2013/071635; 8 pages.

* cited by examiner

MAGNETIC FIELD SENSOR AND METHOD OF FABRICATING A MAGNETIC FIELD SENSOR HAVING A PLURALITY OF VERTICAL HALL ELEMENTS ARRANGED IN AT LEAST A PORTION OF A POLYGONAL SHAPE

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to magnetic field sensors and related fabrication techniques, and, more particularly, to a magnetic field sensor and corresponding fabrication technique having a plurality of vertical Hall elements arranged in at least a portion of a polygonal pattern and also having an electronic circuit coupled to the plurality of vertical Hall elements.

BACKGROUND OF THE INVENTION

Planar Hall elements and vertical Hall elements are known types of magnetic field sensing elements that can be used in magnetic field sensors. A planar Hall element tends to be responsive to magnetic field perpendicular to a surface of a substrate on which the planar Hall element is formed. A vertical Hall element tends to be responsive to magnetic field parallel to a surface of a substrate on which the vertical Hall element is formed.

Other types of magnetic field sensing elements are known. For example, a so-called "circular vertical Hall" (CVH) sensing element, which includes a plurality of vertical magnetic field sensing elements, is known and described in PCT Patent Application No. PCT/EP2008/056517, entitled "Magnetic Field Sensor for Measuring Direction of a Magnetic Field in a Plane," filed May 28, 2008, and published in the English language as PCT Publication No. WO 2008/145662, which application and publication thereof are incorporated by reference herein in their entirety. The CVH sensing element is a circular arrangement of vertical Hall elements arranged over a common circular implant region in a substrate. The CVH sensing element can be used to sense a direction (and optionally a strength) of a magnetic field in a plane of the substrate.

Conventionally, all of the output signals from the plurality of vertical Hall elements within the CVH sensing element are needed in order to determine a direction of a magnetic field. Also conventionally, output signals from the vertical Hall elements of a CVH sensing element are generated sequentially, resulting in a substantial amount of time necessary to generate all of the output signals from the CVH sensing element. Thus, determination of the direction of the magnetic field can take a substantial amount of time.

Various parameters characterize the performance of magnetic field sensing elements. These parameters include sensitivity, which is a change in an output signal of a magnetic field sensing element in response to a change of magnetic field experienced by the magnetic sensing element, and linearity, which is a degree to which the output signal of the magnetic field sensing element varies in direct proportion to the magnetic field. These parameters also include an offset, which is characterized by an output signal from the magnetic field sensing element not representative of a zero magnetic field when the magnetic field sensing element experiences a zero magnetic field.

Another parameter that can characterize the performance of a CVH sensing element is the speed with which output signals from vertical Hall elements within the CVH sensing element can be sampled, and thus, the speed with which a direction of a magnetic field can be identified. Yet another parameter that can characterize the performance of a CVH sensing element is the resolution (e.g., angular step size) of the direction of the magnetic field that can be reported by the CVH sensing element.

As described above, the CVH sensing element is operable, with associated circuits, to provide an output signal representative of an angle of a direction of a magnetic field. Therefore, as described below, if a magnet is disposed upon or otherwise coupled to a so-called "target object," for example, a camshaft in an engine, the CVH sensing element can be used to provide an output signal representative of an angle of rotation, and/or a rotation speed, of the target object.

For reasons described above, a magnetic field sensor that uses a CVH sensing element may have a limit as to how rapidly the magnetic field sensor can identify the direction of a magnetic field, i.e., a rotation angle or rotation speed of a target object. Furthermore, the magnetic field sensor may provide an angular resolution that is too low (too large an angle step size). In general, it may be possible to provide a higher resolution, but at the expense of more time.

Thus, it would be desirable to provide a magnetic field sensing element (or, more generally, a plurality of magnetic field sensing elements) that can be used to generate an output signal more rapidly indicative of an angle of a magnetic field than a CVH sensing element.

SUMMARY OF THE INVENTION

The present invention provides a magnetic field sensing element (or, more generally, a plurality of magnetic field sensing elements) that can be used to generate an output signal more rapidly indicative of an angle of a magnetic field than a CVH sensing element.

In accordance with one aspect of the present invention, a magnetic field sensor includes a semiconductor substrate having a planar surface. The magnetic field sensor also includes a plurality of primary vertical Hall elements disposed on the planar surface. Each one of the plurality of primary vertical Hall elements includes a respective plurality of primary vertical Hall element contacts arranged in a respective line. The lines of primary vertical Hall element contacts are arranged in a pattern representative of at least a portion of a polygonal shape. The plurality of primary vertical Hall elements includes a primary vertical Hall element having a respective line of vertical Hall element contacts not parallel to a line of vertical Hall element contacts of another one of the plurality of primary vertical Hall elements. Each one of the plurality of primary vertical Hall elements is configured to generate a respective magnetic field signal indicative of a projected component of a magnetic field projected upon the plane of the planar surface relative to an angular position of the respective vertical Hall element. The magnetic field sensor also includes an electronic circuit disposed on the planar surface and coupled to each one of the plurality of primary vertical Hall elements. The electronic circuit is configured to generate an output signal indicative of an angle of the projected component of the magnetic field.

In some embodiments, the magnetic field sensor also includes a plurality of secondary vertical Hall elements disposed on the planar surface. Each one of the secondary vertical Hall elements includes a respective plurality of secondary vertical Hall element contacts arranged in a respective line. Each one of the plurality of secondary vertical Hall elements is arranged in a respective group with a respective one of the plurality of primary vertical Hall elements. Each line of secondary vertical Hall element contacts is geometrically arranged at a predetermined angle with a respective line of primary vertical Hall element contacts to form a plurality of parallel groups of vertical Hall elements.

In accordance with another aspect of the present invention, a method of fabricating a magnetic field sensor includes providing a semiconductor substrate having a planar surface. The method also includes forming, on the planar surface, a plurality of primary vertical Hall elements. Each one of the plurality of primary vertical Hall elements comprises a respective plurality of vertical Hall element contacts arranged in a respective line of primary vertical Hall element contacts. The lines of primary vertical Hall element contacts are arranged in a pattern representative of at least a portion a polygonal shape. The plurality of primary vertical Hall elements includes a primary vertical Hall element having a respective line of vertical Hall element contacts not parallel to a line of vertical Hall element contacts of another one of the plurality of primary vertical Hall elements. Each one of the plurality of primary vertical Hall elements is configured to generate a respective magnetic field signal indicative of a projected component of a magnetic field projected upon the plane of the planar surface relative to an angular position of the respective vertical Hall element. The method also includes forming, on the semiconductor substrate, an electronic circuit coupled to each one of the plurality of primary vertical Hall elements. The electronic circuit is configured to generate an output signal representative of an angle of the projected component of the magnetic field.

In some embodiments, the method also includes forming, on the planar surface, a plurality of secondary vertical Hall elements. Each one of the secondary vertical Hall elements includes a respective plurality of secondary vertical. Hall element contacts arranged in a respective line. Each one of the plurality of secondary vertical Hall elements is arranged in a respective group with a respective one of the plurality of primary vertical Hall elements. Each line of secondary vertical Hall element contacts is geometrically arranged at a predetermined angle with a respective line of primary vertical Hall element contacts to form a plurality of parallel groups of vertical Hall elements.

In accordance with another aspect of the present invention, a magnetic field sensor includes a semiconductor substrate having a planar surface. The magnetic field sensor also includes a plurality of magnetic field sensing elements disposed on the planar surface. The plurality of magnetic field sensing elements has a respective plurality of major response axes, each major response axis parallel to the major surface. The plurality of major response axes is arranged in a pattern representative of at least a portion of a polygonal shape. The plurality of magnetic field sensing elements includes a primary vertical Hall element having a major response axis not parallel to major response axis of another one of the plurality of magnetic field sensing elements. Each one of the plurality of magnetic field sensing elements is configured to generate a respective magnetic field signal indicative of a projected component of a magnetic field projected upon the plane of the planar surface relative to an angular position of the response axis of the respective magnetic field sensing element. The magnetic field sensor also includes an electronic circuit disposed on the planar surface and coupled to each one of the plurality of magnetic field sensing elements. The electronic circuit is configured to generate an output signal indicative of an angle of the projected component of the magnetic field.

In some embodiments of the magnetic field sensor, the plurality of magnetic field sensing elements comprises a plurality of magnetoresistance elements.

In accordance with another aspect of the present invention, a method of fabricating a magnetic field sensor includes providing a semiconductor substrate having a planar surface. The method also includes forming, on the planar surface, a plurality of magnetic field sensing elements having a respective plurality of major response axes, each major response axis parallel to the major surface. The plurality of major response axes is arranged in a pattern representative of at least a portion of a polygonal shape. The plurality of magnetic field sensing elements includes a primary vertical Hall element having a major response axis not parallel to major response axis of another one of the plurality of magnetic field sensing elements. Each one of the plurality of magnetic field sensing elements is configured to generate a respective magnetic field signal indicative of a projected component of a magnetic field projected upon the plane of the planar surface relative to an angular position of the response axis of the respective magnetic field sensing element. The method also includes forming, on the semiconductor substrate, an electronic circuit coupled to each one of the plurality of magnetic field sensing elements. The electronic circuit is configured to generate an output signal indicative of an angle of the projected component of the magnetic field.

In some embodiments of the method, the plurality of magnetic field sensing elements comprises a plurality of magnetoresistance elements.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Before describing the present invention, some introductory concepts and terminology are explained. As used herein, the term "magnetic field sensing element" is used to describe a variety of electronic elements that can sense a magnetic field. The magnetic field sensing elements can be, but are not limited to, Hall Effect elements, magnetoresistance elements, or magnetotransistors. As is known, there are different types of Hall Effect elements, for example, a planar Hall element, a vertical Hall element, and a circular Hall element, As is also known, there are different types of magnetoresistance elements, for example, a giant magnetoresistance (GMR) element, an anisotropic magnetoresistance element (AMR), a tunneling magnetoresistance (TMR) element, an Indium antimonide (InSb) sensor, and a magnetic tunnel junction (MTJ).

As used herein, the term "sensor" is used to describe a circuit or assembly that includes a sensing element and other components. In particular, as used herein, the term "magnetic field sensor" is used to describe a circuit or assembly that includes a magnetic field sensing element and electronics coupled to the magnetic field sensing element.

A used herein the terms "primary" and "secondary" are used to denote different physical entities and not to denote any structural or functional differences.

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while magnetoresistance elements and vertical Hall elements (including circular vertical Hall (CVH) sensing elements) tend to have axes of sensitivity parallel to a substrate.

Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet, and a magnetic field sensor that senses a magnetic field density of a magnetic field.

While embodiments shown and described below indicate vertical Hall elements with vertical Hall element contacts arranged in straight lines, in other embodiments, the vertical Hall element contacts of one or more of the vertical Hall elements can be arranged in respective arcs. Thus, as used herein, the term "line" is used to describe either a straight line or a curved line.

Figure 1:
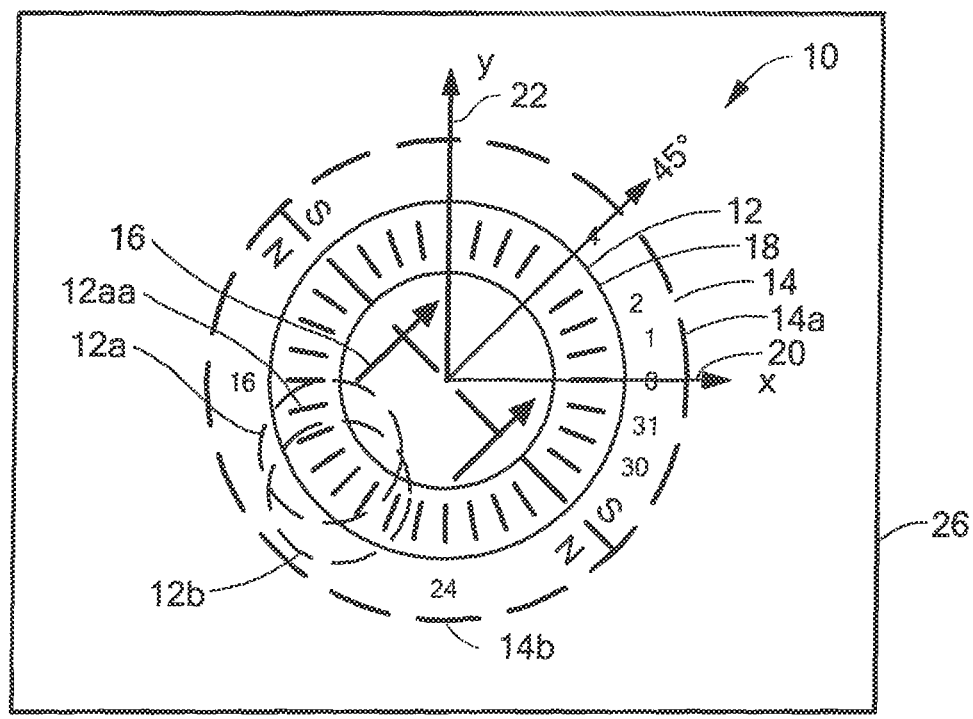
FIG. 1 is a pictorial showing a circular vertical Hall (CVH) sensing element having a plurality of vertical Hall elements arranged in a circle over a common implant region in a substrate and a two pole ring magnet disposed close to the CVH sensing element.

Referring to FIG. 1, a circular vertical Hall (CVH) sensing element 12 includes a circular implant region 18 having a plurality of vertical Hall elements disposed thereon, of which a vertical Hall element 12a is but one example. Each vertical Hall element has a plurality of Hall element contacts (e.g., four or five contacts), of which a vertical Hall element contact 12aa is but one example.

A particular vertical Hall element (e.g., 12a) within the CVH sensing element 12, which, for example, can have five adjacent contacts, can share some, for example, four, of the five contacts with a next vertical Hall element (e.g., 12b). Thus, a next vertical Hall element can be shifted by one contact from a prior vertical Hall element. For such shifts by one contact, it will be understood that the number of vertical Hall elements is equal to the number of vertical Hall element contacts, e.g., 32. However, it will also be understood that a next vertical Hall element can be shifted by more than one contact from the prior vertical Hall element, in which case, there are fewer vertical Hall elements than there are vertical Hall element contacts in the CVH sensing element.

A center of a vertical Hall element 0 is positioned along an x-axis 20 and a center of vertical Hall element 8 is positioned along a y-axis 22. In the exemplary CVH 12, there are thirty-two vertical Hall elements and thirty-two vertical Hall element contacts. However, a CVH can have more than or fewer than thirty-two vertical Hall elements and more than or fewer than thirty-two vertical Hall element contacts.

In some applications, a circular magnet 14 having a south side 14a and a north side 14b can be disposed over the CVH 12. The circular magnet 14 tends to generate a magnetic field 16 having a direction from the north side 14a to the south side 14b, here shown to be pointed to a direction of about forty-five degrees relative to x-axis 20. Other magnets having other shapes and configurations are possible.

In some applications, the circular magnet 14 is mechanically coupled to a rotating object (a target object), for example, an automobile crank shaft or an automobile camshaft, and is subject to rotation relative to the CVH sensing element 12. With this arrangement, the CVH sensing element 12 in combination with an electronic circuit described below can generate a signal related to the angle of rotation of the magnet 14.

The CVH sensing element 12 can be disposed upon a substrate 26, for example, a silicon substrate, along with other electronics (not shown).

Figure 2:
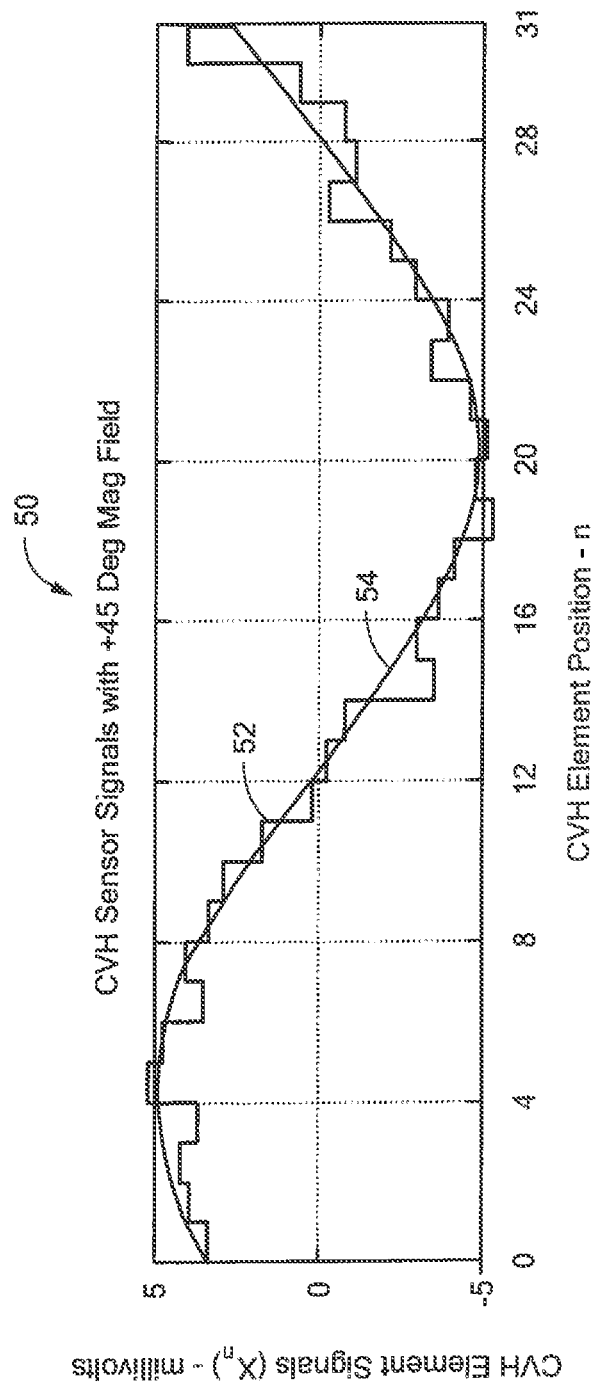
FIG. 2 is a graph showing an output signal as may be generated by the CVH sensing element of FIG. 1.

Referring now to FIG. 2, a graph 50 has a horizontal axis with a scale in units of CVH vertical Hall element position, n, around a CVH sensing element, for example, the CVH sensing element 12 of FIG. 1. The graph 50 also has a vertical axis with a scale in amplitude in units of millivolts.

The graph 50 includes a signal 52 representative of output signal levels from the plurality of vertical Hall elements of the CVH taken sequentially with the magnetic field of FIG. 1 stationary and pointing in a direction of forty-five degrees.

Referring briefly to FIG. 1, as described above, vertical Hall element 0 is centered along the x-axis 20 and vertical Hall element 8 is centered along the y-axis 22. In the exemplary CVH sensing element 12, there are thirty-two vertical Hall element contacts and a corresponding thirty-two vertical Hall elements, each vertical Hall element having a plurality of vertical Hall element contacts, for example, five contacts.

In FIG. 2, a maximum positive signal is achieved from a vertical Hall element centered at position 4, which is aligned with the magnetic field 16 of FIG. 1, such that a line drawn between the vertical Hall element contacts (e.g., five contacts) of the vertical Hall element at position 4 is perpendicular to the magnetic field. A maximum negative signal is achieved from a vertical Hall element centered at position 20, which is also aligned with the magnetic field 16 of FIG. 1, such that a line drawn between the vertical Hall element contacts five contacts) of the vertical Hall element at position 20 is also perpendicular to the magnetic field.

A sine wave 54 is provided to more clearly show the ideal behavior of the signal 52. The signal 52 has variations due to vertical Hall element offsets, which tend to somewhat randomly cause element output signals to be too high or too low relative to the sine wave 54, in accordance with offset errors for each element. The offset signal errors are undesirable. In some embodiments, the offset errors can be reduced by "chopping" each vertical Hall element. Chopping will be understood to be a process by which vertical Hall element contacts of each vertical Hall element are driven in different configurations and signals are received from different ones of the vertical Hall element contacts of each vertical Hall element to generate a plurality of output signals from each vertical Hall element. The plurality of signals can be arithmetically processed (e.g., summed or otherwise averaged) resulting in a signal with less offset.

Pull operation of the CVH sensing element 12 of FIG. 1 and generation of the signal 52 of FIG. 2 are described in more detail in the above-described PCT Patent Application No. PCT/EP2008/056517, entitled "Magnetic Field Sensor for Measuring Direction of a Magnetic Field in a Plane," filed May 28, 2008, which is published in the English language as PCT Publication No. WO 2008/145662.

As will be understood from PCT Patent Application No. PCT/EP2008/056517, groups of contacts of each vertical Hall element can be used in a chopped arrangement to generate chopped output signals from each vertical Hall element. Thereafter, a new group of adjacent vertical Hall element contacts can be selected (i.e., a new vertical Hall element), which can be offset by one or more elements from the prior group. The new group can be used in the chopped arrangement to generate another chopped output signal from the next group, and so on.

Each step of the signal 52 can be representative of a chopped output signal from one respective group of vertical Hall element contacts, i.e., from one respective vertical Hall element. However, in other embodiments, no chopping is performed and each step of the signal 52 is representative of an unchopped output signal from one respective group of vertical Hall element contacts, from one respective vertical Hall element. Thus, the graph 52 is representative of a CVH output signal with or without the above-described grouping and chopping of vertical Hall elements.

It will be understood that, using techniques described above in PCT Patent Application No. PCT/EP2008/056517, a phase of the signal 52 (e.g., a phase of the signal 54) can be found and can be used to identify the pointing direction of the magnetic field 16 of FIG. 1 relative to the CVH sensing element 12.

Figure 3:
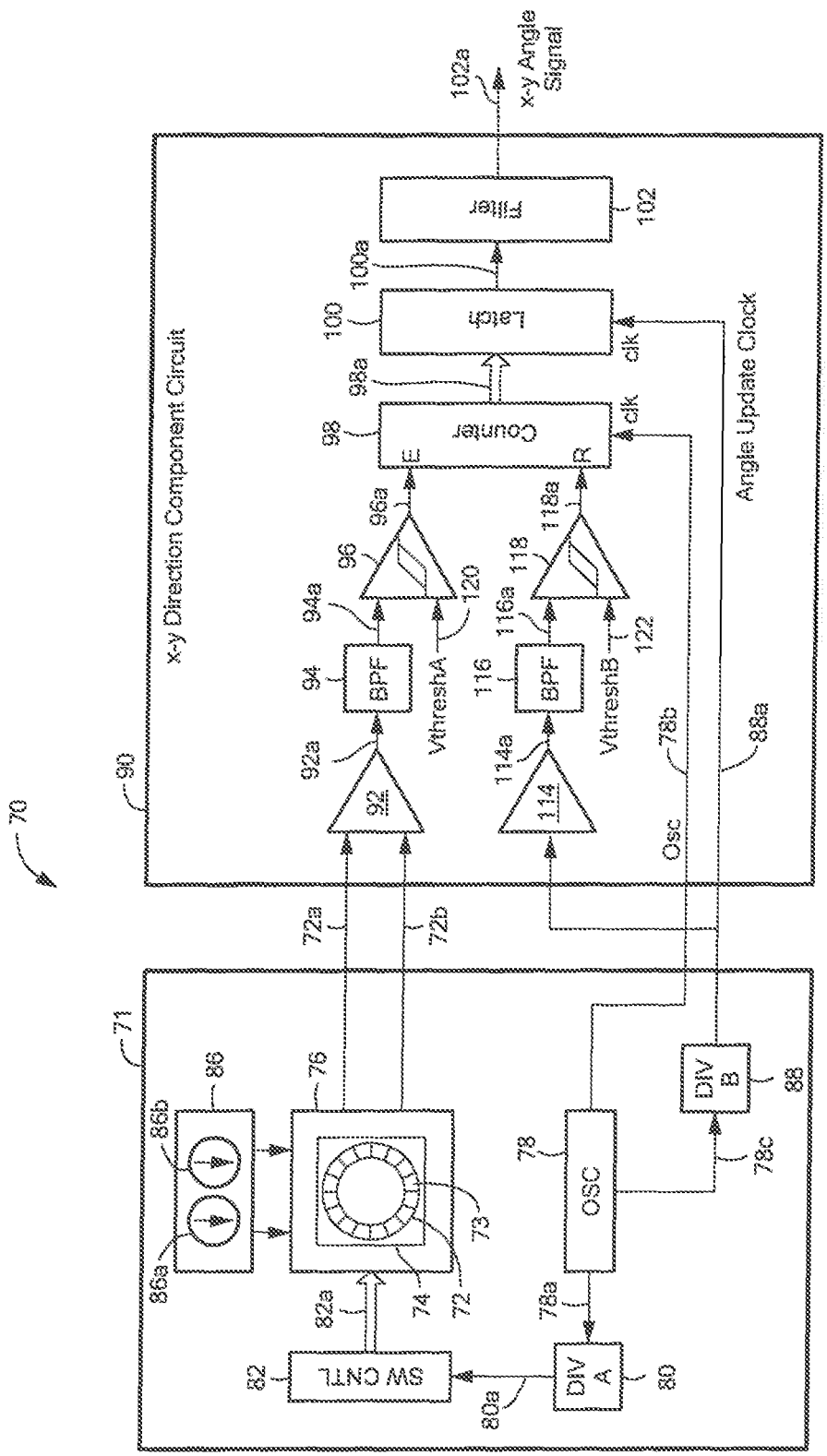
FIG. 3 is a block diagram showing an electronic circuit using a CVH sensing element to determine a direction of a sensed magnetic field.

Referring now to FIG. 3, a magnetic field sensor 70 includes a sensing portion 71. The sensing portion 71 can include a CVH sensing element 72 having a plurality of CVH sensing element contacts, e.g., a CVH sensing element contact 73. In some embodiments there are thirty-two vertical Hall elements in the CVH sensing element 72 and a corresponding thirty-two CVH sensing element contacts. In other embodiments there are sixty-four vertical Hall elements in the CVH sensing element 72 and a corresponding sixty-four CVH sensing element contacts. However, in other embodiments, the CVH sensing element 72 can have more than or fewer than thirty-two vertical Hall elements and/or more than or fewer than thirty-two vertical Hall element contacts.

A magnet (not shown) can be disposed proximate to the CVH sensing element 72, and can be coupled to a target object (not shown). The magnet can be the same as or similar to the magnet 14 of FIG. 1

As described above, the (NH sensing element 72 can have a plurality of vertical Hall elements, each vertical Hall element comprising a group of vertical Hall element contacts (e.g., five vertical Hall element contacts), of which the vertical Hall element contact 73 is but one example.

In some embodiments, a switching circuit 74 can provide sequential CVH differential output signals 72a, 72b from the CVH sensing element 72.

The CVH differential output signal 72a, 72b is comprised of sequential output signals taken one-at-a-time around the (NH sensing element 72, wherein each output signal is generated on a separate signal path and switched by the switching circuit 74 into the path of the differential output signal 72a, 72b. The signal 52 of FIG. 2 can be representative of the differential signal 72a, 72b. Therefore, the CVH differential output signal 72a, 72b can be represented as a switched set of CVH output signals $x_n=x_0$ to $x_{N-1}$, taken one at a time, where n is equal to a vertical Hall element position (i.e., a position of a group of vertical Hall element contacts that form a vertical Hall element) in the CVH sensing element 72, and where there are N such positions.

In one particular embodiment, the number of vertical Hall elements (each comprising a group of vertical Hall element contacts) in the CVH sensing element 72 is equal to the total number of sensing element positions, N. In other words, the CVH differential output signal 72a, 72b can be comprised of sequential output signals, wherein the CVH differential output signal 72a, 72b is associated with respective ones of the vertical Hall elements in the CVH sensing element 72 as the switching circuit 74 steps around the vertical Hall elements of the CVH sensing element 72 by increments of one, and N equals the number of vertical Hall elements in the CVH sensing element 72. However, in other embodiments, the increments can be by greater than one vertical Hall element, in which case N is less than the number of vertical Hall elements in the CVH sensing element 72.

In one particular embodiment, the CVH sensing element 72 has thirty-two vertical Hall elements, i.e., N=32, and each step is a step of one vertical Hall element contact position (i.e., one vertical Hall element position). However, in other embodiments, there can be more than thirty-two or fewer than thirty-two vertical Hall elements in the CVH sensing element 72, for example sixty-four vertical Hall elements. Also, the increments of vertical Hall element positions, n, can be greater than one vertical Hall element contact.

In some embodiments, another switching circuit 76 can provide the above-described "chopping" of groups of the vertical Hall elements within the CVH sensing element 72. Chopping will be understood to be an arrangement in which a group of vertical Hall element contacts, for example, five vertical Hall element contacts that form one vertical Hall element, are driven with current sources 86 in a plurality of different connection configurations, and signals are received from the group of vertical Hall element contacts in corresponding different configurations to generate the CVH differential output signal 72a, 72b. Thus, in accordance with each vertical Hall element position, n, there can be a plurality of sequential output signals during the chopping, and then the group increments to a new group, for example, by an increment of one vertical Hall element contact.

The sensing portion 71 can also include current sources 86 configured to drive the CVH sensing element 72. While current sources 86 are shown, in other embodiments, the current sources 86 can be replaced by voltage sources.

The magnetic field sensor 70 includes an oscillator 78 that provides clock signals 78a, 78b, 78c, which can have the same or different frequencies. A divider 80 is coupled to receive the clock signal 78a and configured to generate a divided clock signal 80a. A switch control circuit 82 is coupled to receive the divided clock signal 80a and configured to generate switch control signals 82a, which are received by the switching circuits 74, 76 to control the sequencing around the CVH sensing element 72, and optionally, to control the chopping of groups of vertical Hall elements within the CVH sensing element 72 in ways described above.

The magnetic field sensor 70 can include a divider 88 coupled to receive the clock signal 78c and configured to generate a divided clock signal 88a, also referred to herein as an "angle update clock" signal.

The magnetic field sensor 70 also includes an x-y direction component circuit 90. The x-y direction component circuit 90 can include an amplifier 92 coupled to receive the CVH differential output signals 72a, 72b. The amplifier 92 is configured to generate an amplified signal 92a. A bandpass filter 94 is coupled to receive the amplified signal 92a and configured to generate a filtered signal 94a. A comparator 96, with or without hysteresis, is configured to receive the filtered signal 94a. The comparator 96 is also coupled to receive a threshold signal 120. The comparator 96 is configured to generate a thresholded signal 96a generated by comparison of the filtered signal 94a with the threshold signal 120.

The x-y direction component circuit 90 also includes an amplifier 114 coupled to receive the divided clock signal 88a. The amplifier 114 is configured to generate an amplified signal 114 a. A bandpass filter 116 is coupled to receive the amplified signal 114a and configured to generate a filtered signal 116a. A comparator 118, with or without hysteresis, is coupled to receive the filtered signal 116a. The comparator 118 is also coupled to receive a threshold signal 122. The comparator 118 is configured to generate a thresholded signal 118a by comparison of the filtered signal 116a with the threshold signal 122.

The bandpass filters 94, 116 can have center frequencies equal to 1/T, where T is the time that it takes to sample all of the vertical Hall elements within the CVH sensing element 72.

It should be understood that the amplifier 114, the bandpass filter 116, and the comparator 118 provide a delay of the divided clock signal 88a in order to match a delay of the circuit channel comprised of the amplifier 92, the bandpass filter 94, and the comparator 96. The matched delays provide phase matching, in particular, during temperature excursions of the magnetic field sensor 70.

A counter 98 can be coupled to receive the thresholded signal 96a at an enable input, to receive the clock signal 78b at a clock input, and to receive the thresholded signal 118a at a reset input.

The counter 98 is configured to generate a phase signal 98a having a count representative of a phase difference between the thresholded signal 96a and the thresholded signal 118a.

The phase shift signal 98a is received by a latch 100 that is latched upon an edge of the divided clock signal 88a. The latch 100 is configured to generate a latched signal 100a, also referred to herein as an "x-y angle signal."

It will be apparent that the latched signal 100a is a multi-bit digital signal that has a value representative of a direction of an angle of the magnetic field experience by the CVH sensing element 72, and thus, an angle of the magnet and target object. The signal 52 of FIG. 2 is representative of the latched signal 100a.

In some embodiments, the magnetic field sensor 70 can also include a filter 102 coupled to receive the latched signal 100a and configured to generate a filtered signal 102a. The signal 54 of FIG. 2 is representative of the filtered signal 102a.

In some embodiments, the clock signals 78a, 78b, 78c each have a frequency of about 30 MHz, the divided clock signal 80a has a frequency of about 8 MHz, and the angle update clock signal 88a has a frequency of about 30 kHz. However in other embodiments, the initial frequencies can be higher or lower than these frequencies With the magnetic field sensor 70, it will be appreciated that an update rate of the x-y angle signal 100a occurs at a rate equivalent to a rate at which all of the vertical Hall elements within the CVH sensing element 72 are collectively sampled. An exemplary rate is described below in conjunction with FIG. 4

Referring again briefly to FIG. 2, it will be understood that all of the vertical Hall elements within the CVH sensing element 72 are sampled in sequence to achieve an update of the x-y angle signal 100a. Sampling all of the vertical Hall elements can take an appreciable amount of time.

Figure 4:
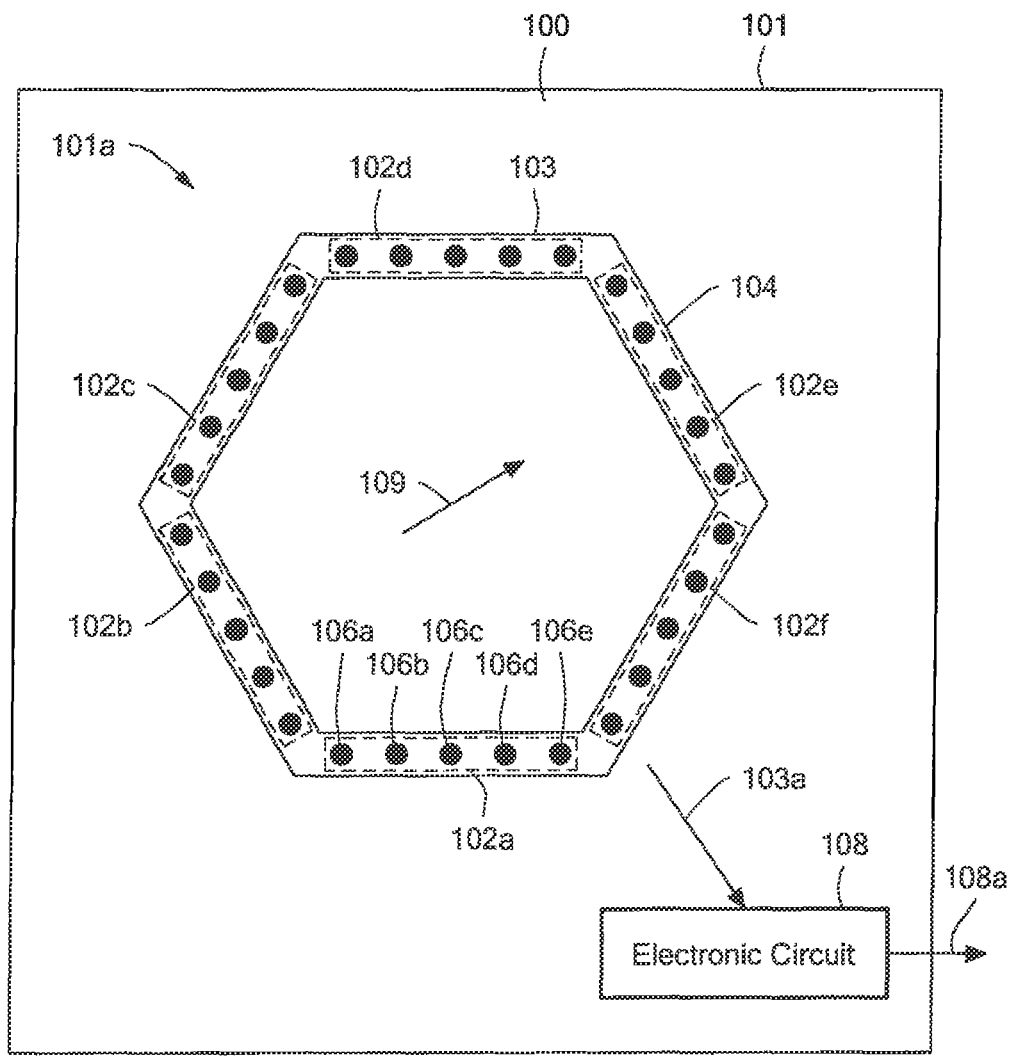
FIG. 4 is a pictorial of an exemplary magnetic field sensor having six vertical Hall elements arranged in a hexagonal pattern over a common implant region in a substrate.

Referring now to FIG. 4, a magnetic field sensor 100 includes a semiconductor substrate 101 having a planar surface 101a. The magnetic field sensor 100 also includes a plurality of vertical Hall elements 103, individually 102a, 10M, 102c, 102d, 102e, 102f, disposed on the planar surface 101a. Taking the vertical Hall elements 102a as being representative of other ones of the plurality of vertical Hall elements, each one of the vertical Hall elements includes a respective plurality of vertical Hall element contacts like vertical Hall element contacts 106a, 106b, 106c, 106d, 106e. Each plurality of vertical Hall element contacts is arranged in a respective line. The lines of vertical Hall element contacts are arranged in a pattern representative of a polygonal shape, here a hexagon.

Each one of the plurality of vertical Hall elements 102a, 102b, 102c, 102d, 102e, 102f is configured to generate a respective magnetic field signal responsive to of an angle of a projected component 109 of a magnetic field projected upon the plane of the planar surface 101a relative to an angular position of the respective vertical Hall element. A magnet is not shown, but can be the same as or signal to the magnet 18 of FIG. 1 and disposed proximate to the plurality of magnetic field sensing elements 103. Here, sequential output signals from the plurality of vertical Hall elements 103 are indicated as a signal 103a. The signal 103a can be similar to the differential signal 72a, 72b of FIG. 3.

Again taking the vertical Hall element 102a is being representative of other ones of the vertical Hall elements, the vertical Hall element 102a is operated by driving a current into selected ones, e.g., two, of the vertical Hall element contacts 106a, 106b, 106d, 106d, 106e, in which case, an output signal is generated at the non-selected ones, e.g., three, of the vertical Hall element contacts. In a chopping process, used to reduce the effect of any offset voltage of the vertical Hall element 102a, the selection of vertical Hall element contacts that are driven and vertical Hall element contacts from which output signals are received can be changed in a chopping sequence in a plurality of so-called "phases." Typical chopping arrangements use two such phases, referred to herein as 2×, or four such phases, referred to herein as 4×, however, other chopping arrangements are also possible.

The magnetic field sensor 100 can also include an electronic circuit 108 disposed on the planar surface 101a and coupled to each one of the plurality of vertical Hall elements 103. The electronic circuit 108 is configured to generate an output signal 108a indicative of the angle of the projected component of the magnetic field. The electronic circuit 108 can be the same as or similar to that shown above in conjunction with FIG. 3, wherein the CVH sensing element 72 is replaced by the plurality of vertical Hall elements 103.

In operation, each one of the plurality of vertical Hall elements 103 can be processed by the electronic circuit 108 sequentially. Unlike the magnetic field sensor 70 of FIG. 3, for which vertical Hall elements within the CVH sensing element 72 overlap and share vertical Hall element contacts, here, the plurality of vertical Hall elements 103 does not share vertical Hall element contacts. It will become apparent from discussion below in conjunction with FIG. 9 that such an arrangement tends to generate an output signal that has fewer and larger steps than the output signal 52 of FIG. 2. However, the filter 102 of FIG. 3 can be adjusted to smooth out the steps. Because there are fewer steps in the output signal (see, e.g., FIGS. 2 and 9), a magnetic field sensor, like the magnetic field sensor 70 of FIG. 3, that uses the plurality of vertical Hall elements 103, can run at high speeds (i.e., speeds of rotation of a sensed magnetic field). The filter 102 introduces a fixed time delay, but does not necessarily impact the speed of operation, i.e., throughput of output samples.

The plurality of vertical Hall elements 103 includes, and is arranged over, a common implant region in the planar surface 101a of the substrate 101.

Referring briefly again to FIG. 3, in some embodiments, the electronic circuit 108 can include first and second vertical Hall element driving circuits 86a, 86b, respectively. The switching circuit 74 can be coupled between the first and second vertical Hall element driving circuits 86a, 86b and the plurality of vertical Hall elements 103. Not to be confused with chopping, which dwells upon one vertical Hall element at a time, the switching circuit 74 can be configured to switch couplings between the first and second vertical Hall element driving circuits 86a, 86b and the plurality of vertical Hall elements 103, e.g., a changing two of the plurality of vertical Hall elements 103 . . . . During a time when one of the plurality of vertical Hall elements 103 is being driven by the first vertical Hall element driving circuit 86a and processed by the electronic circuit 108, another one of the plurality of vertical Hall elements 103 can be driven by the second vertical Hall element driving circuit 86b. With this arrangement, the electronic circuit 108 can more rapidly sequence through the plurality of vertical Hall elements, since a next vertical Hall element can be ready for sampling when sampling of a present vertical Hall element is complete.

As described above, each one of the plurality of vertical Hall elements 102a, 102b, 102c, 102d, 102e, 102f is responsive to (i.e., differently responsive to) the magnetic field 109 (or the projection 109 of a magnetic field) in the plane of the surface 101a of the substrate 101. In particular, each vertical Hall element generates (sequentially) an output signal related to an angle of the magnetic field 109 relative to an orientation of the respective vertical Hall element. For the magnetic field 109 shown at a particular angle, the vertical Hall elements 102b, 102e, for which lines between associated vertical Hall element contacts are perpendicular to the magnetic field 109, have the greatest sensitivity. One of the vertical Hall elements 102b, 102e generates a largest positive output signal and the other one of the vertical Hall elements 102b, 102e generates a largest negative output signal. Other ones of the vertical Hall elements generate smaller output signals.

For the magnetic field 109 shown at the particular angle, it will also be appreciated that the vertical Hall elements 102b, 102e generate output signals with approximately the same amplitude but with opposite signs. The amplitudes of the output signals from the two vertical Hall elements 102b, 102e, i.e., a pair of vertical Hall elements, differ by small amounts due to small differences in sensitivity of the two vertical Hall elements 102b, 102e, due to small differences in offset voltage of the two vertical Hall elements 102b, 102e, and also due to position placement inaccuracy of the plurality of magnetic field sensing elements 103 relative to a magnet (not shown). The sensitivity difference can be reduced by integrated circuit fabrication techniques, including dimensional and process control. The offset voltage differences can be reduced by various techniques, for example, the above-described chopping.

For the magnetic field 109 shown at the particular angle, other pairs of vertical Hall elements also generate output signals with the same amplitude but with different signs. The vertical Hall element pair 102c, 102f and also the vertical Hall element pair 102a, 102d generate output signals with the same amplitude but with different signs, each pair producing output signals with smaller amplitudes than the vertical Hall element pair 102b, 102e.

For a magnetic field at other angles in the plane of the surface 101a, similarly, pairs of vertical Hall elements generate output signals with substantially the same amplitudes, but with opposite signs. Thus, as described below in conjunction with FIGS. 7, 7A, 8, and 8A, it is possible to remove some of the vertical Hall elements, for example, one, two, or three of the vertical Hall elements 102a, 102b, 102d, 102d, 102e, 102f and to still reconstruct the output signal using only the remaining vertical Hall elements.

The magnetic field sensor 100 can generate an output signal more rapidly indicative of an angle of a magnetic field that the CVH sensing element of FIGS. 1 and 3. The CVH sensing element described above in conjunction with FIG. 1 and the magnetic field sensor described above in conjunction with FIG. 3, when used with a 4× (four phase) chopping, with a CVH sensing element with 64 CVH sensing elements, and with a master clock frequency of 8 MHz (see, e.g., clock 80a of FIG. 3), results in a CVH sensing element sequence frequency (frequency of sample revolutions around CVH sensing element) of 31.25 kHz. This frequency is equivalent to a response time of the CVH sensing element (like cycle time of FIG. 2, but for 64 CVH sensing elements) of about thirty-two microseconds.

In comparison, the magnetic field sensor 100 of FIG. 4, when used with 4× chopping, with six vertical Hall elements as shown, and with a master clock of 8 MHz, results in a sequence frequency of 333 kHz and a response time of about three microseconds, much faster than the CVH sensing element. Furthermore, techniques described below in conjunction with FIGS. 7, 7A, 8, and 8A can reduce the number of vertical Hall elements further, for example, to three vertical Hall elements, resulting in a response time of about 1.5 microseconds. As described below, while hexagonal patterns of vertical Hall elements are used in examples herein, other patterns are also possible.

Figure 5:
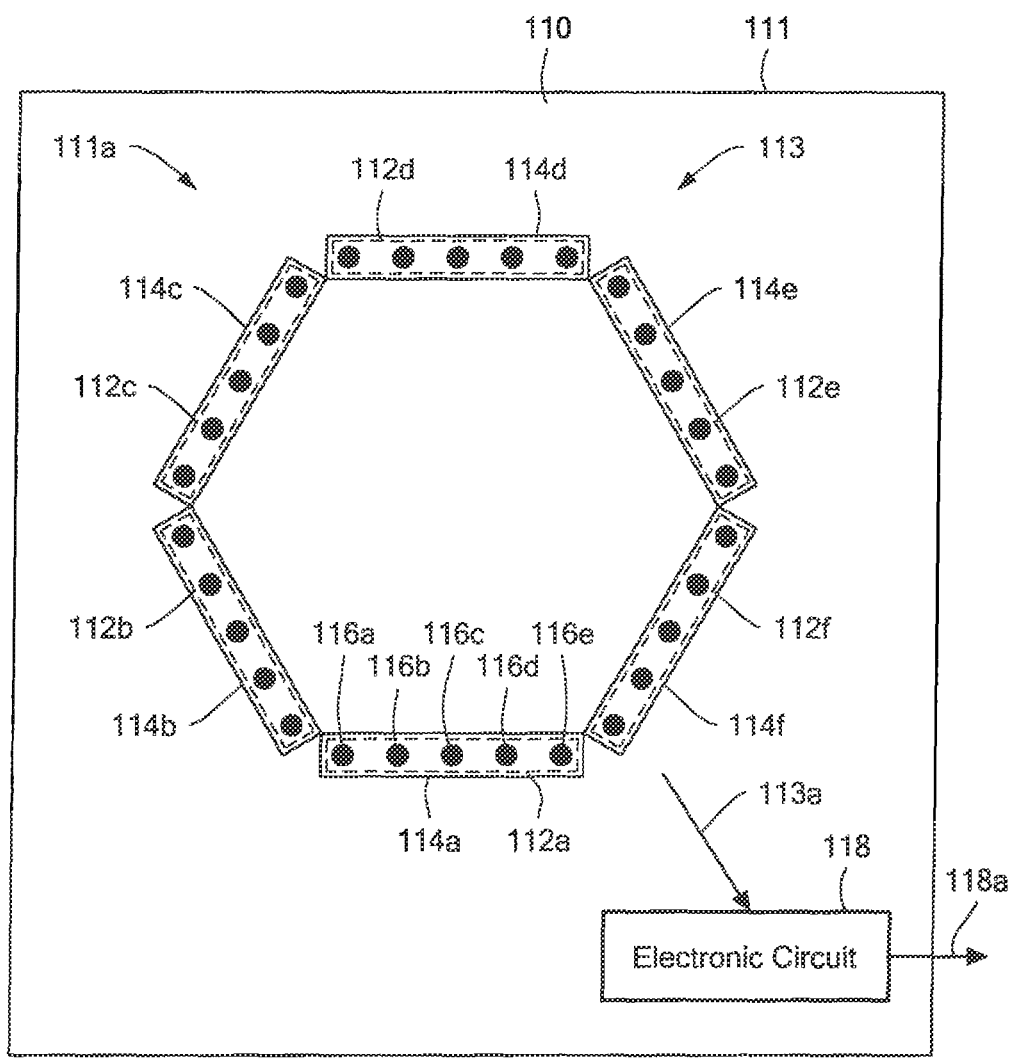
FIG. 5 is a pictorial of another exemplary magnetic field sensor having six vertical. Hall elements arranged in a hexagonal pattern, each arranged over separate implant regions.

Referring now to FIG. 5, a magnetic field sensor 110 is like the magnetic field sensor 100 of FIG. 4. However the magnetic field sensor 110 includes a plurality of vertical Hall elements 113, individually 112a, 112b, 112c, 112d, 112e, 112f, arranged over separate implant regions 114a, 114b, 114c, 114d, 114d, 114f, respectively, in a substrate 111.

The magnetic field sensor 110 can be arranged on the semiconductor substrate 111 having a planar surface 111a.

An electronic circuit 118 is coupled to receive signals 113a from the plurality of vertical Hall elements 113. The electronic circuit 118 is configured to generate an output signal 118a. The electronic circuit 118 and the output signal 118a can be the same as or similar to the electronic circuit 108 and the output signal 108a of FIG. 4.

Figure 6:
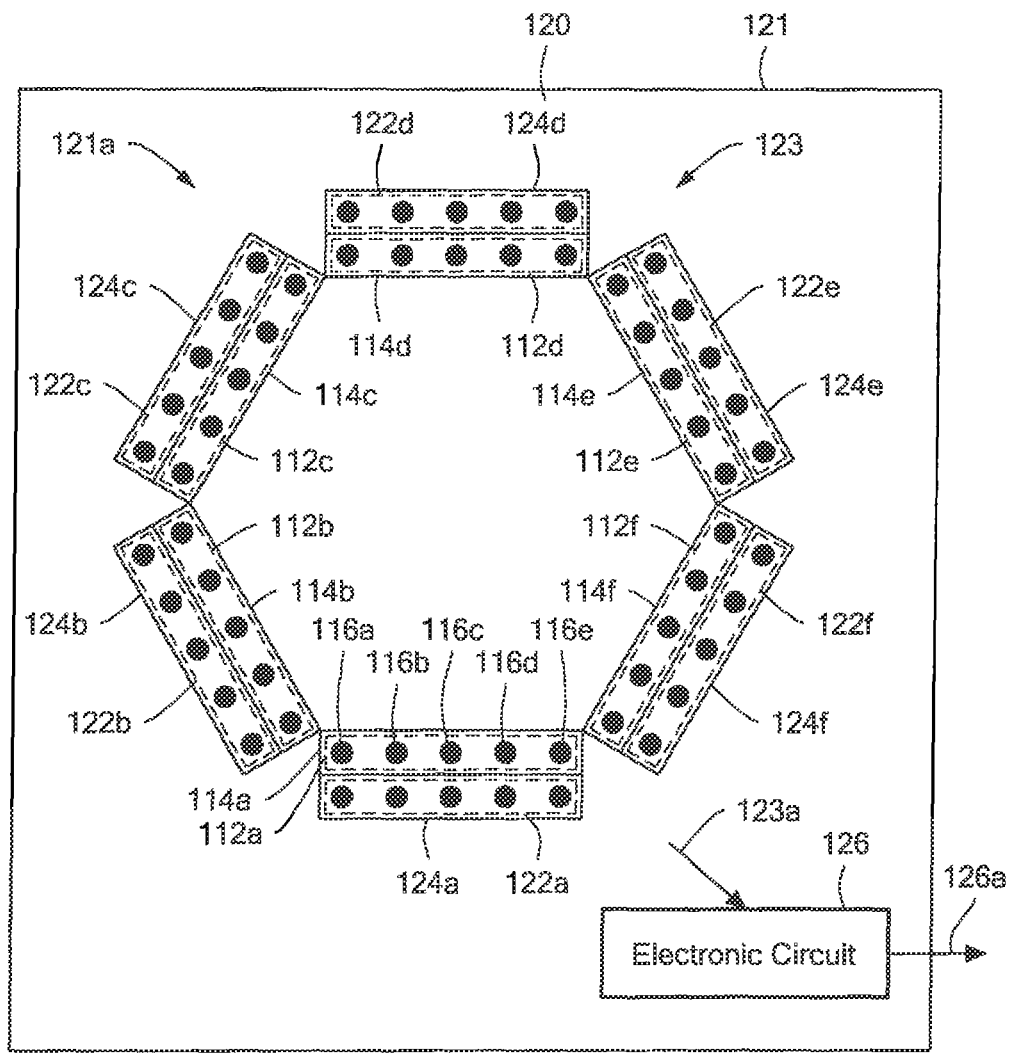
FIG. 6 is a pictorial of another exemplary magnetic field sensor having six primary vertical Hall elements arranged in a hexagonal pattern and also having six secondary vertical Hall elements arranged in a hexagonal pattern.

Referring now to FIG. 6, a magnetic field sensor 120 includes a semiconductor substrate 121 having a planar surface 121a. The magnetic field sensor 120 also includes a plurality of vertical Hall elements 123. The plurality of vertical Hall elements 123 includes, as a primary plurality of vertical Hall elements, the vertical Hall elements 112a, 112b, 112c, 112d, 112e, 112f of FIG. 5. Unlike the magnetic field sensor 110 of FIG. 5, the plurality of vertical Hall elements 123 also includes, as a secondary plurality of vertical Hall elements, vertical Hall elements 122a, 122b, 122c, 122d, 122e, 122f. The secondary plurality of vertical Hall elements is arranged over separate implant regions 124a, 124b, 124c, 124d, 124e, 124f respectively.

However, like the arrangement of FIG. 4, in other embodiments, the primary plurality of vertical Hall elements 112a, 112b, 112c, 112d, 112e, 112f can be arranged over a first common implant region and the secondary plurality of vertical Hall elements 122a, 122b, 122c, 122d, 122e, 122f can be arranged over a second common implant region in the substrate 121.

Taking the secondary vertical Hall element 122a as being representative of other ones of the plurality of vertical Hall elements, each one of the secondary plurality of vertical Hall elements includes a respective plurality of vertical Hall element contacts like vertical Hall element contacts 116a, 116b, 116c, 116d, 116e. Each plurality of secondary vertical Hall element contacts is arranged in a respective line. The lines of secondary vertical Hall element contacts are arranged in a pattern representative of a polygonal shape, here a hexagon. Each one of the lines of the secondary vertical Hall element contacts can be geometrically parallel to a respective line of the primary vertical Hall element contacts. However, in other embodiments, the polygon of secondary vertical Hall elements can be rotated in relation to the polygon of primary vertical Hall elements. The rotation can be small, for example, 0.1 degrees, or the rotation can be large, for example thirty degrees.

Each one of the primary plurality of vertical Hall elements 112a, 112b, 112c, 112d, 112e, 112f and each one of the secondary plurality of vertical Hall elements 122a, 122b, 122c, 122d, 122e, 122f is configured to generate a respective magnetic field signal responsive to of an angle of a projected component of a magnetic field (see, e.g., 110 of FIG. 4) projected upon the plane of the planar surface 121a relative to an angular position of the respective vertical Hall element. Here, sequential output signals from plurality of vertical Hall elements 123 are indicated as a signal 123a. The signal 123a can be similar to the differential signal 72a, 72b of FIG. 3 and similar to the signal 103a of FIG. 4 and the signal 113a of FIG. 5.

The magnetic field sensor 120 can also include an electronic circuit 126 disposed on the planar surface 121a and coupled to each one of the plurality of vertical Hall elements 123. The electronic circuit 126 is configured to generate an output signal 126a indicative of the angle of the projected component of the magnetic field. The electronic circuit can be the same as or similar to that shown above in conjunction with FIG. 3, wherein the CVH sensing element 72 is replaced by the plurality of vertical Hall elements 123.

In operation, in some embodiments, each one of the plurality of vertical Hall elements 123 can be processed by the electronic circuit 126 sequentially, resulting in a pattern of twelve sequential samples within the signal 123a. Unlike the magnetic field sensor 70 of FIG. 3, for which vertical Hall elements within the CVH sensing element 72 overlap and share vertical Hall element contacts, here, the vertical Hall elements 123 do not share vertical Hall element contacts. It will become apparent from discussion below in conjunction with FIG. 9 that such an arrangement tends to generate an output signal that has fewer and larger steps than the output signal 52 of FIG. 2. However, the filter 102 of FIG. 3 can be adjusted to smooth out the steps.

In some embodiments, each one of the primary plurality of vertical Hall elements 112a, 112b, 112c, 112d, 112e, 112f is electronically coupled in parallel with an adjacent one of the secondary plurality of vertical Hall elements 122a, 122b, 122c, 122d, 122e, 122E resulting in a pattern of six sequential samples within the signal 123a.

The electronically parallel arrangement can be accomplished in two different ways. In a first parallel coupling, only output signals of each adjacent pair of the plurality of vertical Hall elements 123 are coupled in parallel. In the first parallel coupling, drive signals provided to each one of the plurality of vertical Hall elements 123 in an adjacent pair of vertical Hall elements can be different. In particular, for embodiments that use chopping, the different drive signals can be at different chopping phases at any time.

In a second parallel coupling, output signals of each adjacent pair of the plurality of vertical Hall elements 123 are coupled in parallel, and also the drive signals to each adjacent pair of the plurality of vertical Hall elements 123 are coupled in parallel.

In yet another parallel arrangement, output signals from each adjacent pair of the plurality of vertical Hall elements 123 are summed at a subsequent amplifier, with or without parallel drive signals to the vertical Hall elements 123.

It should be appreciated that, with either electronically parallel coupled arrangement of the vertical Hall elements, output signal with higher signal to noise ratios are generated by each parallel pair of vertical Hall elements, higher than that which would be generated by any one vertical Hall element. Thus, the magnetic field sensor 120 can achieve higher signal-to-noise ratios than the magnetic field sensors 100, 110 of FIG. 4 or 5.

While the plurality of vertical Hall elements 123 is shown to include parallel pairs of vertical Hall elements, in other embodiments, there can be parallel groups of vertical Hall elements, each parallel group having two or more geometrically parallel vertical Hall elements.

Figure 7:
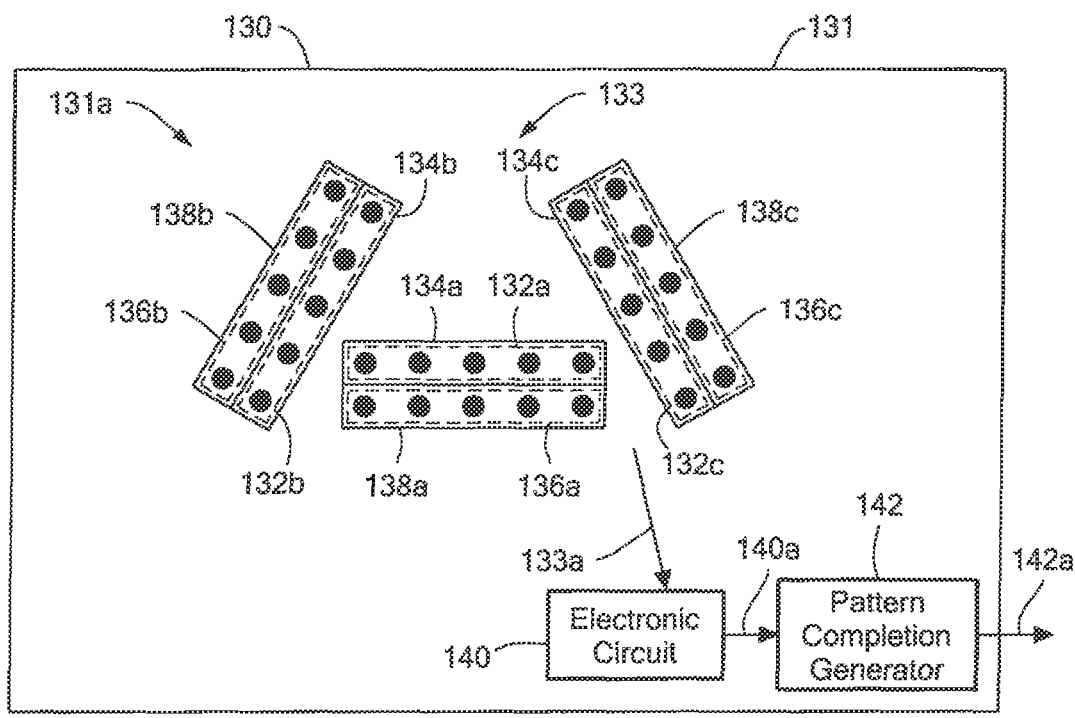
FIG. 7 is a pictorial of another exemplary magnetic field sensor having three primary vertical Hall elements arranged a portion of (here half of) a hexagonal pattern and also having three secondary vertical Hall elements arranged in a half of a hexagonal pattern.

Referring now to FIG. 7, a magnetic field sensor 130 includes a semiconductor substrate 131 having a planar surface 131a. The magnetic field sensor 130 also includes a plurality of vertical Hall elements 133. The plurality of vertical Hall elements 133 includes, as a primary plurality of vertical Hall elements, primary vertical Hall elements 132a, 132b, 132c. The plurality of vertical Hall elements 133 also includes, as a secondary plurality of vertical Hall elements, secondary vertical Hall elements 136a, 136b, 136c. The primary and secondary pluralities of vertical Hall elements are arranged over separate implant regions 134a, 134b, 134c, 138a, 138b, 138c.

Each one of the primary vertical Hall elements and each one of the secondary vertical Hall elements includes a respective plurality of vertical Hall element contacts. Each plurality of primary vertical Hall elements contacts and each plurality of secondary vertical Hall element contacts is arranged in a respective line. The lines of primary and secondary vertical Hall element contacts are arranged in a pattern representative of a portion of polygonal shape, here a portion of a hexagon. Each one of the lines of the secondary vertical Hall element contacts can be geometrically parallel to a respective line of the primary vertical Hall element contacts. However, in other embodiments, each line of secondary vertical Hall elements can be rotated in relation to a respective line of primary vertical Hall elements. The rotation can be small, for example, 0.1 degrees, or the rotation can be large, for example thirty degrees.

Each one of the primary plurality of vertical Hall elements 132*a*, 132*b*, 132*c* and each one of the secondary plurality of vertical Hall elements 136*a*, 136*b*, 136*c* is configured to generate a respective magnetic field signal responsive to of an angle of a projected component of the magnetic field projected upon the plane of the planar surface relative to an angular position of the respective vertical Hall element. Here, sequential output signals from plurality of vertical Hall elements 133 are indicated as a signal 133*a*. The signal 133*a* can be similar to the differential signal 72*a*, 72*b* of FIG. 3 and similar to the signal 103*a* of FIG. 4, the signal 113*a* of FIG. 5, and the signal 123*a* of FIG. 6.

The magnetic field sensor 130 can also include an electronic circuit 140 disposed on the planar surface 131*a* and coupled to each one of the plurality of vertical Hall elements 133. The electronic circuit 136 is configured to generate an output signal 140*a*. The magnetic field sensor 130 can also include a pattern completion generator 142 coupled to receive the output signal 140*a* and configured to generate an output signal 142*a* indicative of the angle of the projected component of the magnetic field. The electronic circuit 140 can be the same as or similar to that shown above in conjunction with FIG. 3, wherein the CVH sensing element 72 is replaced by the plurality of vertical Hall elements 133.

The electronic circuit 140 and the pattern completion generator 142 are both electronic circuits disposed upon the substrate 131, and both together are referred to herein as an electronic circuit.

In operation, in some embodiments, each one of the plurality of vertical Hall elements 133 can be processed by the electronic circuit 140 sequentially, resulting in a pattern of six sequential samples within the signal 133*a*. Unlike the magnetic field sensor 70 of FIG. 3, for which vertical Hall elements within the CVH sensing element 72 overlap and share vertical Hall element contacts, here, the plurality of vertical Hall elements 133 do not share vertical Hall element contacts. It will become apparent from discussion below in conjunction with FIG. 9 that such an arrangement tends to generate an output signal that has fewer and larger steps than the output signal 52 of FIG. 2. However, the filter 102 of FIG. 3 can be adjusted to smooth out the steps.

In some embodiments, each one of the primary plurality of vertical Hall elements 132*a*, 132*b*, 132*c* is electronically coupled in parallel with an adjacent one of the secondary plurality of vertical Hall elements 136*a*, 136*b*, 136*c*, resulting in a pattern of three sequential samples within the signal 133*a*.

As described above in conjunction with FIG. 6, the electronically parallel arrangement can be accomplished in different ways. In a first parallel coupling, only output signals of each adjacent pair of the vertical Hall elements are coupled in parallel. In the first parallel coupling, drive signals provided to each one of the vertical Hall elements in an adjacent pair of vertical Hall elements can be different. In particular, for embodiments that use chopping, the different drive signals can be at different chopping phases at any time.

In a second parallel coupling, output signals of each adjacent pair of the vertical Hall elements are coupled in parallel, and also the drive signals to each adjacent pair of the vertical Hall elements are coupled in parallel.

In other embodiment, signals from lines of the primary and secondary vertical Hall elements can be combined at a subsequent amplifier.

It should be appreciated that, with either electronically parallel arrangement of the vertical Hall elements, output signals generated by each parallel pair of vertical Hall elements are larger than that which we would be generated by any one vertical Hall element. Thus, the magnetic field sensor 130 can achieve higher signal-to-noise ratios than the magnetic field sensors 100, 110 of FIG. 4 or 5.

Unlike the magnetic field sensors of FIGS. 4-6, the plurality of vertical Hall elements 133 is representative of only a portion of a polygonal shape. However, as described above in conjunction with FIG. 4, the plurality of vertical Hall elements 133 can be used to deduce other output signals as may be generated by vertical Hall elements that would otherwise form missing sides of the polygonal shape. Referring briefly to FIG. 6, it will be understood that vertical Hall elements on opposite sides of the hexagonal shape have opposite output signals (i.e., signal values) but of the same amplitude when the magnetic field sensor 120 of FIG. 6 experiences a magnetic field in the plane of the surface 121*a*. Thus, if a pair of vertical Hall elements 132*b*, 136*b* of FIG. 7 is like a pair of vertical Hall elements 112*c*, 122*c* of FIG. 6, then a signal that would otherwise be generated by a pair of vertical Hall elements 112*f*, 124*f* of FIG. 6, counterparts of which are not present in FIG. 7, can be deduced or calculated by generating another signal as an opposite of the signal generated by the pair of vertical Hall elements 132*b*, 136*b*. Therefore, even though the plurality of vertical Hall elements 133 is representative of only a portion of a polygonal shape, for example, half of a hexagon, electronic magnetic field signals that would otherwise be generated by the other half of the hexagon, which is not present, can be calculated from the electronic magnetic field signals generated by the vertical Hall elements that are present.

To this end, in order to represent a complete polygon, the pattern completion generator 142 completes the hexagonal pattern by deducing or calculating electronic signals from those within the output signal 140*a*, which calculated electronic signals are not directly generated by the plurality of vertical Hall elements 133.

While the plurality of vertical Hall elements 133 is shown to include parallel pairs of vertical Hall elements, in other embodiments, there can be parallel groups of vertical Hall elements, each parallel group having two or more geometrically parallel vertical Hall elements.

Comparing the magnetic field sensor 130 to the magnetic field sensor 120 of FIG. 6, because the magnetic field sensor 130 only generates the output signals 133*a* from three parallel pairs of vertical Hall elements and calculates other signals to represent a complete polygonal shape of vertical Hall elements, the magnetic field sensor 130 can achieve an indication of the angle of the magnetic field faster than the magnetic field sensor 120 of FIG. 6.

Figure 7A:
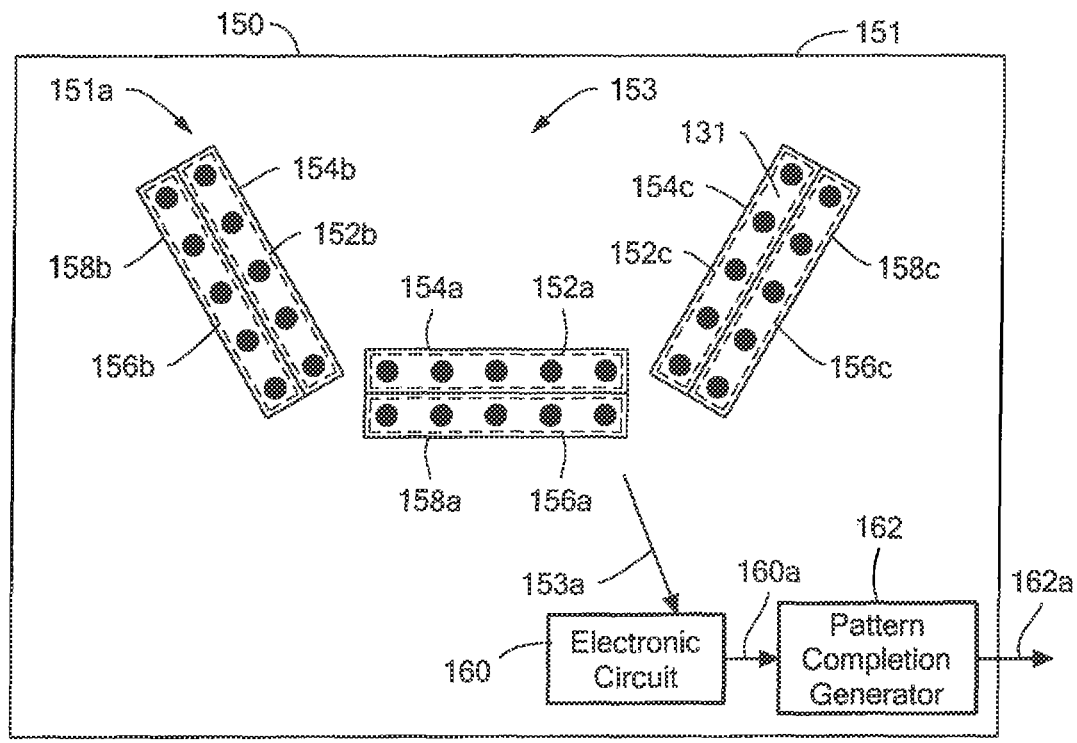
FIG. 7A is a pictorial of another exemplary magnetic field sensor having three primary vertical Hall elements arranged in a portion of (here half of) of a hexagonal pattern and also having three secondary vertical Hall elements arranged in a half of a hexagonal pattern.

Referring now to FIG. 7A, a magnetic field sensor 150 is similar to the magnetic field sensor 130 of FIG. 7. However, the magnetic field sensor 150 includes a plurality of vertical Hall elements 153 that are representative of a different portion of a polygonal shape than the plurality of vertical Hall elements 133 of FIG. 7. Nevertheless, elements of and function of the magnetic field sensor 150 will be understood from the discussion above in conjunction with FIG. 7.

Figure 8:
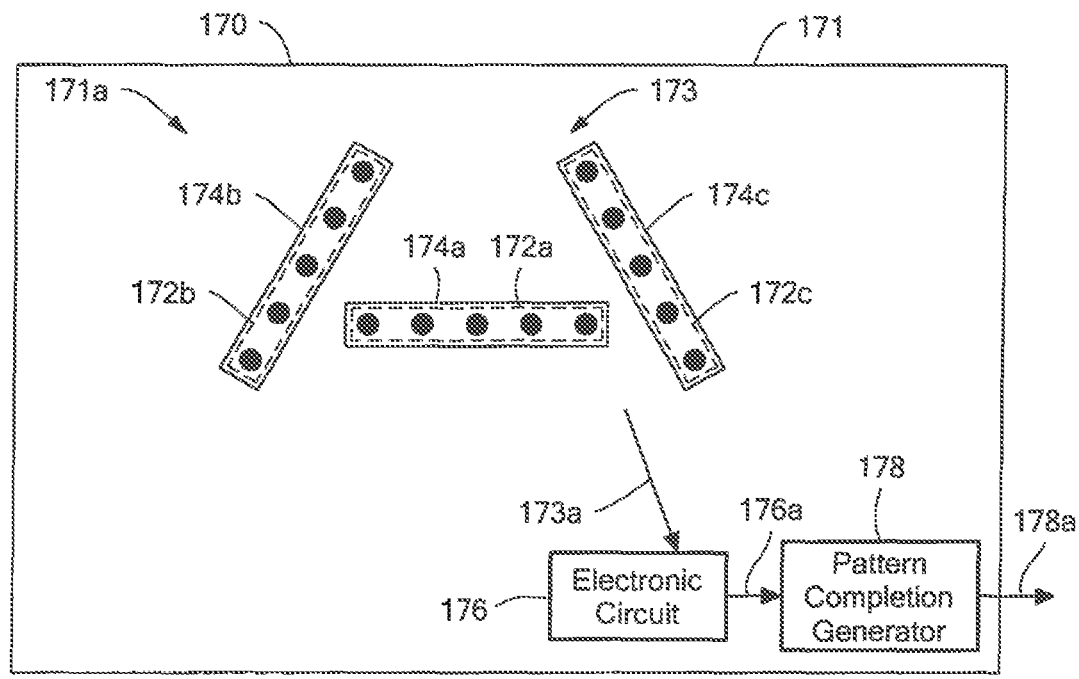
FIG. 8 is a pictorial of another exemplary magnetic field sensor having three vertical Hall elements arranged a portion of (here half of) of a hexagonal pattern.

Referring now to FIG. 8, a magnetic field sensor 170 is also similar to the magnetic field sensor 130 of FIG. 7. However, the magnetic field sensor 170 includes a plurality of vertical Hall elements 173 having only three vertical Hall elements 172a, 172b, 172c. The plurality of vertical Hall elements 173 does not include a secondary plurality of vertical Hall elements. An electronic, circuit 176 and a pattern generator 178 can be the same as or similar to those described above in conjunction with FIG. 7. Elements of and function of the magnetic field sensor 170 will be understood from the discussion above in conjunction with FIG. 7.

Figure 8A:
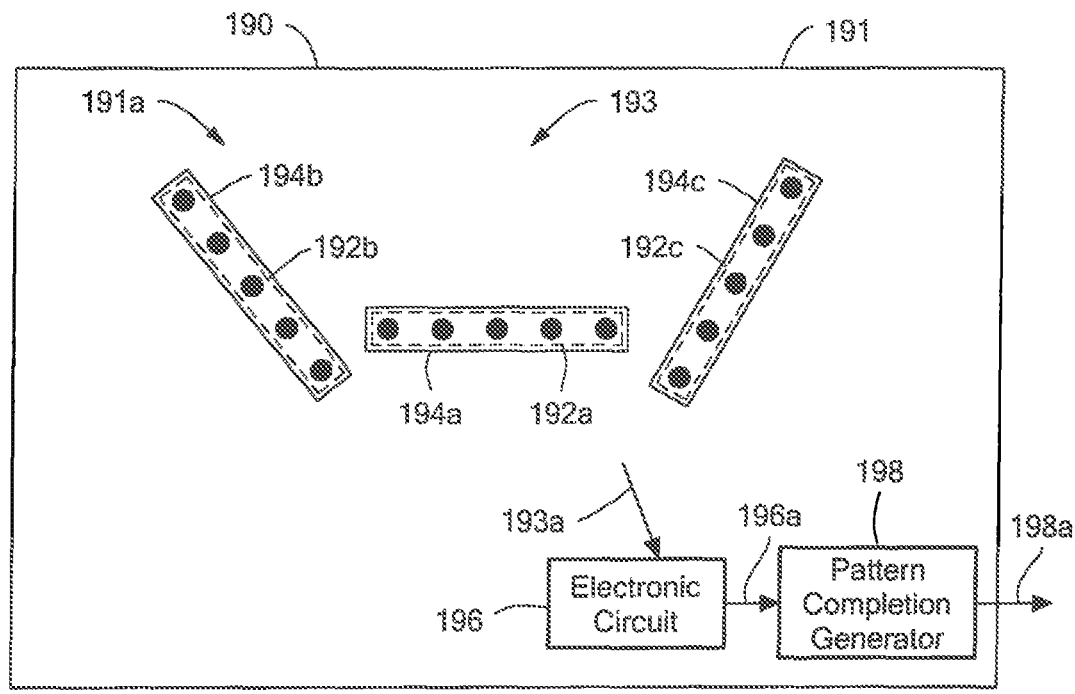
FIG. 8A is a pictorial of another exemplary magnetic field sensor having three vertical Hall elements arranged a portion of (here half of) of a hexagonal pattern.

Referring now to FIG. 8A, a magnetic field sensor 190 is also similar to the magnetic field sensor 150 of FIG. 7A. However, the magnetic field sensor 170 includes a plurality of vertical Hall elements 193 having only three vertical Hall elements 192a, 192b, 192c. The plurality of vertical Hall elements 193 does not include a secondary plurality of vertical Hall elements. An electronic circuit 196 and a pattern generator 198 can be the same as or similar to those described above in conjunction with FIG. 7. Elements of and function of the magnetic field sensor 190 will be understood from the discussion above in conjunction with FIGS. 7 and 7A.

While examples above show six (or twelve) vertical Hall elements with lines of vertical Hall element contacts arranged in hexagonal polygonal shapes, in other embodiments, other numbers of vertical Hall elements can be arranged with vertical Hall element contacts arranged in lines representative of other polygonal shapes having any number of sides greater than three sides.

While examples above show three (or six) vertical Hall elements with lines of vertical Hall element contacts arranged in half of hexagonal polygonal shapes, in other embodiments, other numbers of vertical Hall elements can be arranged with vertical. Hall element contacts arranged in lines representative of other portions of polygonal shapes, for example, three quarters of a polygonal shape.

While vertical Hall elements having five vertical Hall element contacts are shown in examples above, in other embodiments, each vertical Hall element can have more than five or fewer than five vertical Hall element contacts.

Figure 9:
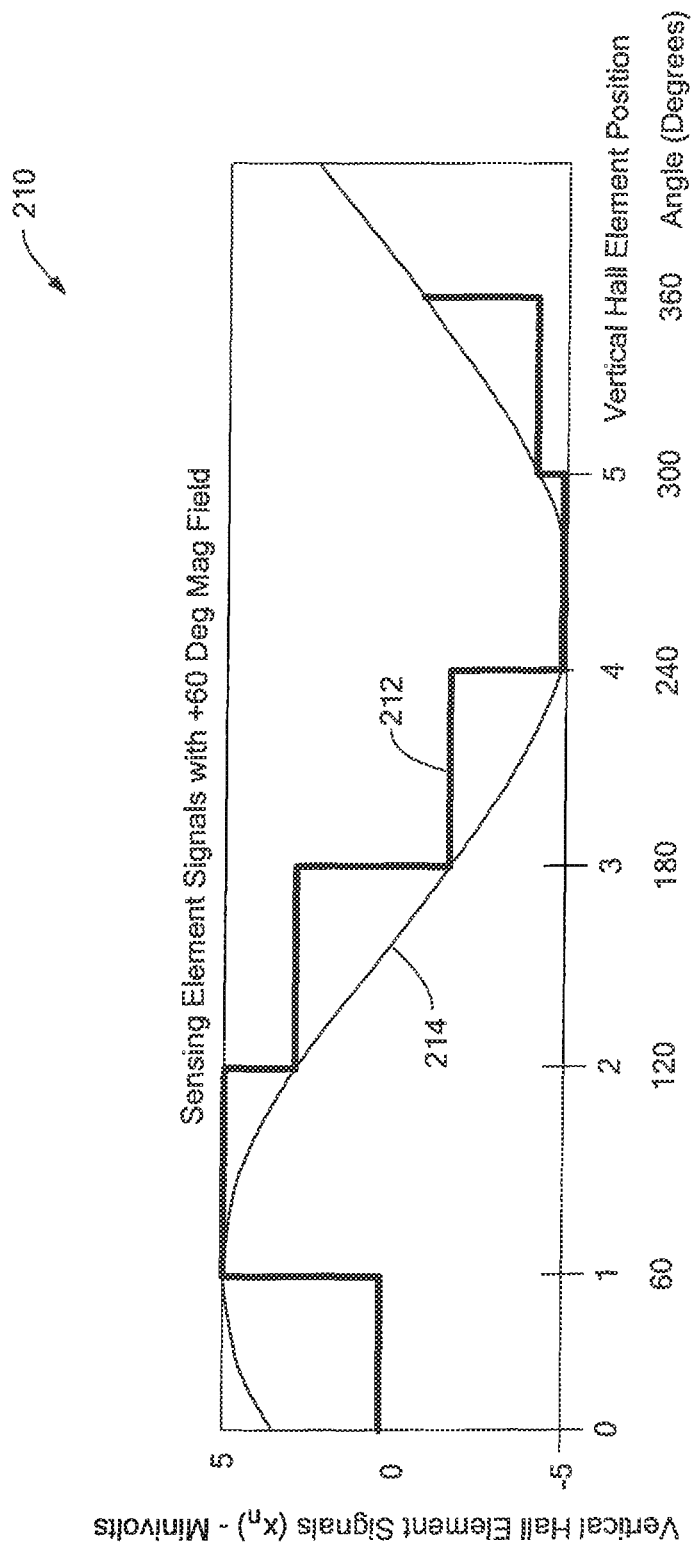
FIG. 9 is a graph showing output signal that can be generated by the vertical Hall elements of the arrangement of FIGS. 4 and 5.

Referring now to FIG. 9 is a graph 210 is similar to the graph 50 of FIG. 2. The graph 50 has a horizontal axis with a scale in units of vertical Hall element position, n, around a polygonal arrangement of vertical Hall elements, for example, around the plurality of vertical Hall elements 103 of FIG. 4. The graph 210 also has a vertical axis with a scale in amplitude in units of millivolts.

The graph 210 includes a signal 212 representative of output signal levels from the plurality of vertical Hall elements of 102a, 102b, 102c, 102d, 102e, 102f of FIG. 4 taken sequentially when in the presence of a magnetic field, stationary and pointing in a direction of sixty degrees.

In FIG. 9, a maximum positive signal is achieved from one of the six vertical Hall elements 102a, 102b, 102c, 102d, 102e, 102f, which is best aligned with the magnetic field at sixty degrees, such that the line of vertical Hall element contacts (e.g., five contacts) of the vertical Hall element is closest to perpendicular to the magnetic field. A maximum negative signal is achieved from another vertical Hall, which is also aligned with the magnetic field 16 of FIG. 1, such that the line of vertical Hall element contacts (e.g., five contacts) of the vertical Hall element is also perpendicular to the magnetic field.

A sine wave 214 is provided to more clearly show the ideal behavior of the signal 212. The sine wave can be generated by the filter 102 of FIG. 3, The signal 214 can have variations due to vertical Hall element offsets, which tend to somewhat randomly cause element output signals to be too high or too low relative to the sine wave 214, in accordance with offset errors for each element. The offset signal errors are undesirable. In some embodiments, the offset errors can be reduced by the use of chopping described above. Chopping, as described above in conjunction with FIG. 4, will be understood to be a process by which vertical Hall element contacts of each vertical Hall element are driven in different configurations and signals are received from different ones of the vertical Hall element contacts of each vertical Hall element to generate a plurality of output signals from each vertical Hall element. The plurality of signals can be arithmetically processed (e.g., summed or otherwise averaged) resulting in a signal with less offset. An offset generated by the vertical Hall elements induces non linearity in the sinusoidal signal (see, e.g., FIGS. 2 and 9) that can be further reduced with a filter (not shown) centered at or near the sinusoidal frequency.

Groups of contacts of each vertical Hall element can be used in a chopped arrangement to generate chopped output signals from each vertical Hall element. Thereafter, a new group of adjacent vertical Hall element contacts can be selected (i.e., a new vertical Hall element). The new group can be used in the chopped arrangement to generate another chopped output signal from the next group, and so on.

Each step of the signal 212 can be representative of a chopped output signal from one respective group of vertical Hall element contacts, i.e., from one respective vertical Hall element. However, in other embodiments, no chopping is performed and each step of the signal 212 is representative of an unchopped output signal from one respective group of vertical Hall element contacts, i.e., from one respective vertical Hall element. Thus, the graph 212 is representative of a CVH output signal with or without the above-described grouping and chopping of vertical Hall elements.

It will be understood from discussion above in conjunction with FIG. 3, that a phase of the signal 212 (e.g., a phase of the signal 214) can be found and can be used to identify the pointing direction of the magnetic field relative to the polygonal pattern of vertical Hall elements.

While embodiments shown and described above indicate vertical Hall elements, in other embodiments, one or more of the vertical Hall elements can instead be a respective one or more magnetoresistance elements having respective axes of sensitivity aligned in the same directions as those of the above-described vertical Hall elements. Also, other types of magnetic field sensing elements are possible, so long as they have axis of sensitivity aligned in the same directions as those of the above-described vertical Hall elements. It will be apparent how to modify the electronic circuit of FIG. 3 to use the various other types of magnetic field sensing elements.

All references cited herein are hereby incorporated herein by reference in their entirety.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

What is claimed is:

1. A magnetic field sensor, comprising:
   a semiconductor substrate having a planar surface;
   a plurality of primary vertical Hall elements disposed on the planar surface, wherein each one of the plurality of primary vertical Hall elements comprises a respective plurality of primary vertical Hall element contacts arranged in a respective line, wherein the lines of primary vertical Hall element contacts are arranged in a pattern representative of at least a portion of a polygonal shape, wherein the plurality of primary vertical Hall elements includes a primary vertical Hall element having a respective line of vertical Hall element contacts not parallel to a line of vertical Hall element contacts of another one of the plurality of primary vertical Hall elements, wherein each one of the plurality of primary vertical Hall elements is configured to generate a respective magnetic field signal indicative of a projected component of a magnetic field projected upon the plane of the planar surface relative to an angular position of the respective vertical Hall element; and an electronic circuit disposed on the planar surface and coupled to each one of the plurality of primary vertical Hall elements, wherein the electronic circuit is configured to generate an output signal indicative of an angle of the projected component of the magnetic field.

2. The magnetic field sensor of claim 1, wherein the plurality of primary vertical Hall elements comprises a common primary implant region in the planar surface of the substrate.

3. The magnetic field sensor of claim 1, wherein the plurality of primary vertical Hall elements comprises separate primary implant regions in the planar surface of the substrate and does not comprise a common primary implant region in the planar surface of the substrate.

4. The magnetic field sensor of claim 1, wherein the lines of the primary vertical Hall element contacts are arranged in straight lines and in a pattern representative of a polygonal shape.

5. The magnetic field sensor of claim 1, wherein the lines of the primary vertical Hall element contacts are arranged in straight lines and in a pattern representative of half of a polygonal shape.

6. The magnetic field sensor of claim 5, wherein the electronic circuit is further configured to use the plurality of primary vertical Hall elements to generate magnetic field signals representative of an entire polygonal shape.

7. The magnetic field sensor of claim 1, further comprising:
a plurality of secondary vertical Hall elements disposed on the planar surface, wherein each one of the secondary vertical Hall elements comprises a respective plurality of secondary vertical Hall element contacts arranged in a respective line, wherein each one of the plurality of secondary vertical Hall elements is arranged in a respective group with a respective one of the plurality of primary vertical Hall elements, wherein each line of secondary vertical Hall element contacts is geometrically arranged at a predetermined angle with a respective line of primary vertical Hall element contacts to form a plurality of parallel groups of vertical Hall elements.

8. The magnetic field sensor of claim 7, wherein the lines of primary vertical Hall element contacts are arranged in straight lines and in a pattern representative of a polygonal shape.

9. The magnetic field sensor of claim 7, wherein the lines of primary vertical Hall element contacts are arranged in straight lines and in a pattern representative of half of a polygonal shape.

10. The magnetic field sensor of claim 9, wherein the electronic circuit is further configured to use the plurality of primary and secondary vertical Hall elements to generate magnetic field signals representative of an entire polygonal shape.

11. The magnetic field sensor of claim 7, wherein the plurality of secondary vertical Hall elements comprises a common secondary implant region in the planar surface of the substrate.

12. The magnetic field sensor of claim 7, wherein the plurality of secondary vertical Hall elements comprises separate secondary implant regions in the planar surface of the substrate and do not comprise a common secondary implant region in the planar surface of the substrate.

13. The magnetic field sensor of claim 7, wherein respective magnetic field signals generated by vertical Hall elements of each one of the plurality of parallel groups of vertical Hall elements are respectively summed in the electronic circuit.

14. The magnetic field sensor of claim 7, wherein the vertical Hall elements of each parallel group of vertical Hall elements are respectively coupled in parallel.

15. The magnetic field sensor of claim 7, wherein no parallel group of vertical Hall elements has lines of vertical Hall element contacts that are parallel to lines of vertical Hall element contacts within another parallel group of vertical Hall elements.

16. The magnetic field sensor of claim 7, wherein the electronic circuit comprises:
first and second vertical Hall element driving circuits; and
a selection circuit coupled between the first and second vertical Hall element driving circuits and the plurality of parallel groups of vertical Hall elements,
wherein the selection circuit is configured to switch couplings between the first and second vertical Hall element driving circuits and the plurality of parallel groups of vertical Hall elements,
wherein, during a time when one of the plurality of parallel groups of vertical Hall elements is being driven by the first vertical Hall element driving circuit and processed by the electronic circuit, another one of the plurality of parallel groups of vertical Hall elements is being driven by the second vertical Hall element driving circuit.

17. The magnetic field sensor of claim 7, wherein the electronic circuit further comprises a switching circuit coupled to the plurality of parallel groups of vertical Hall elements and configured to select from among the plurality of parallel groups of vertical Hall elements such that selected ones of the plurality of parallel groups of vertical Hall elements generate respective magnetic field signals at different times on the same signal path.

18. The magnetic field sensor of claim 1, wherein the electronic circuit further comprises:
first and second vertical Hall element driving circuits; and
a selection circuit coupled between the first and second vertical Hall element driving circuits and the plurality of primary vertical Hall elements,
wherein the selection circuit is configured to switch couplings between the first and second vertical Hall element driving circuits and the plurality of primary vertical Hall elements,
wherein, during a time when one of the plurality of primary vertical Hall elements is being driven by the first vertical Hall element driving circuits and processed by the electronic circuit, another one of the plurality of primary vertical Hall elements is being driven by the second vertical Hall element driving circuit.

19. The magnetic field sensor of claim 1, wherein the electronic circuit further comprises a switching circuit coupled to the plurality of primary vertical Hall elements and configured to select from among the plurality of primary vertical Hall elements such that selected ones of the plurality of primary vertical Hall elements generate respective magnetic field signals at different times on the same signal path.

20. A method of fabricating a magnetic field sensor, comprising:

providing a semiconductor substrate having a planar surface;

forming, on the planar surface, a plurality of primary vertical Hall elements, wherein each one of the plurality of primary vertical Hall elements comprises a respective plurality of vertical Hall element contacts arranged in a respective line of primary vertical Hall element contacts, wherein the lines of primary vertical Hall element contacts are arranged in a pattern representative of at least a portion of a polygonal shape, wherein the plurality of primary vertical Hall elements includes a primary vertical Hall element having a respective line of vertical Hall element contacts not parallel to a line of vertical Hall element contacts of another one of the plurality of primary vertical Hall elements, wherein each one of the plurality of primary vertical Hall elements is configured to generate a respective magnetic field signal indicative of a projected component of a magnetic field projected upon the plane of the planar surface relative to an angular position of the respective vertical Hall element; and forming, on the semiconductor substrate, an electronic circuit coupled to each one of the plurality of primary vertical Hall elements, wherein the electronic circuit is configured to generate an output signal representative of an angle of the projected component of the magnetic field.

21. The method of claim 20, wherein the forming the plurality of primary vertical Hall elements comprises forming a common primary implant region in the planar surface of the substrate.

22. The method of claim 20, wherein the forming the plurality of primary vertical Hall elements comprises forming separate primary implant regions in the planar surface of the substrate and not forming a common primary implant region in the planar surface of the substrate.

23. The method of claim 20, wherein the lines of primary vertical Hall element contacts are arranged in straight lines and in a pattern representative of a polygonal shape.

24. The method of claim 20, wherein the lines of primary vertical Hall element contacts are arranged in straight lines and in a pattern representative of half of a polygonal shape.

25. The method of claim 20, further comprising:

forming, on the planar surface, a plurality of secondary vertical Hall elements, wherein each one of the secondary vertical Hall elements comprises a respective plurality of secondary vertical Hall element contacts arranged in a respective line, wherein each one of the plurality of secondary vertical Hall elements is arranged in a respective group with a respective one of the plurality of primary vertical Hall elements, wherein each line of secondary vertical Hall element contacts is geometrically arranged at a predetermined angle with a respective line of primary vertical Hall element contacts to form a plurality of parallel groups of vertical Hall elements.

26. The method of claim 25, wherein the lines of primary vertical Hall element contacts are arranged in straight lines and in a pattern representative of a polygonal shape.

27. The method of claim 25, wherein the lines of primary vertical Hall element contacts are arranged in straight lines and in a pattern representative of half of a polygonal shape.

28. The method of claim 25, wherein the forming the plurality of secondary vertical Hall elements comprises forming a common secondary implant region in the planar surface of the substrate.

29. The method of claim 25, wherein the forming the plurality of secondary vertical Hall elements comprises forming separate secondary implant regions in the planar surface of the substrate and not forming a common secondary implant region in the planar surface of the substrate.

30. The method of claim 25, further comprising:
respectively coupling in parallel the vertical Hall elements of each parallel group of vertical Hall elements.

31. The method of claim 25, wherein no parallel group of vertical Hall elements has lines of vertical Hall element contacts that are parallel to lines of vertical Hall element contacts within another parallel group of vertical Hall elements.

32. The method of claim 25, wherein the forming the electronic circuit comprises:

forming first and second vertical Hall element driving circuits; and forming a selection circuit coupled between the first and second vertical Hall element driving circuits and the plurality of parallel groups of vertical Hall elements, wherein the selection circuit is configured to switch couplings between the first and second vertical Hall element driving circuits and the plurality of parallel groups of vertical Hall elements, wherein, during a time when one of the plurality of parallel groups of vertical Hall elements is being driven by the first vertical Hall element driving circuits and processed by the electronic circuit, another one of the plurality of parallel groups of vertical Hall elements is being driven by the second vertical Hall element driving circuit.

33. The method of claim 25, wherein the forming the electronic circuit further comprises:

forming a switching circuit coupled to the plurality of parallel groups of vertical Hall elements and configured to select from among the plurality of parallel groups of vertical Hall elements such that selected ones of the plurality of parallel groups of vertical Hall elements generate respective magnetic field signals at different times on the same signal path.

34. The method of claim 20, wherein the forming the electronic circuit comprises:

forming first and second vertical Hall element driving circuits; and forming a selection circuit coupled between the first and second vertical Hall element driving circuits and the plurality of primary vertical Hall elements, wherein the selection circuit is configured to switch couplings between the first and second vertical Hall element driving circuits and the plurality of primary vertical Hall elements, wherein, during a time when one of the plurality of primary vertical Hall elements is being driven by the first vertical Hall element driving circuits and processed by the electronic circuit, another one of the plurality of primary vertical Hall elements is being driven by the second vertical Hall element driving circuit.

35. The method of claim 20, wherein the forming the electronic circuit further comprises:

forming a switching circuit coupled to the plurality of primary vertical Hall elements and configured to select from among the plurality of primary vertical Hall elements such that selected ones of the plurality of primary vertical Hall elements generate respective magnetic field signals at different times on the same signal path.

36. A magnetic field sensor, comprising:

a semiconductor substrate having a planar surface;

a plurality of magnetic field sensing elements disposed on the planar surface, the plurality of magnetic field sensing elements having a respective plurality of major response axes, each major response axis parallel to the major surface, wherein the plurality of major response axes is arranged in a pattern representative of at least a portion of a polygonal shape, wherein the plurality of magnetic field sensing elements includes a primary vertical Hall element having a major response axis not parallel to major response axis of another one of the plurality of magnetic field sensing elements, wherein each one of the plurality of magnetic field sensing elements is configured to generate a respective magnetic field signal indicative of a projected component of a magnetic field projected upon the plane of the planar surface relative to an angular position of the response axis of the respective magnetic field sensing element; and an electronic circuit disposed on the planar surface and coupled to each one of the plurality of magnetic field sensing elements, wherein the electronic circuit is configured to generate an output signal indicative of an angle of the projected component of the magnetic field.

37. The magnetic field sensor of claim 36, wherein the plurality of magnetic field sensing elements comprises a plurality of magnetoresistance elements.

38. A method of fabricating a magnetic field sensor, comprising:

providing a semiconductor substrate having a planar surface;

forming, on the planar surface, a plurality of magnetic field sensing elements having a respective plurality of major response axes, each major response axis parallel to the major surface, wherein the plurality of major response axes is arranged in a pattern representative of at least a portion of a polygonal shape, wherein the plurality of magnetic field sensing elements includes a primary vertical Hall element having a major response axis not parallel to major response axis of another one of the plurality of magnetic field sensing elements, wherein each one of the plurality of magnetic field sensing elements is configured to generate a respective magnetic field signal indicative of a projected component of a magnetic field projected upon the plane of the planar surface relative to an angular position of the response axis of the respective magnetic field sensing element; and forming, on the semiconductor substrate, an electronic circuit coupled to each one of the plurality of magnetic field sensing elements, wherein the electronic circuit is configured to generate an output signal indicative of an angle of the projected component of the magnetic field.

39. The method of claim 38, wherein the plurality of magnetic field sensing elements comprises a plurality of magnetoresistance elements.

* * * * *

UNITED STATES PATENT AND TRADEMARK OFFICE
CERTIFICATE OF CORRECTION

Page 1 of 2

PATENT NO. : 8,749,005 B1
APPLICATION NO. : 13/724170
DATED : June 10, 2014
INVENTOR(S) : Andrea Foletto et al.

It is certified that error appears in the above-identified patent and that said Letters Patent is hereby corrected as shown below:

In the specification

Column 3, line 22 delete "portion a" and replace with --portion of a--.

Column 4, line 62 delete "arranged a" and replace with --arranged as a--.

Column 5, line 5 delete "arranged a" and replace with --arranged as a--.

Column 5, line 8 delete "arranged a" and replace with --arranged as a--.

Column 5, line 36 delete "A" and replace with --As--.

Column 7, line 2 delete "contacts five contacts)" and replace with --contacts (e.g., five contacts)--.

Column 7, line 21 delete "Pull." and replace with --Full--.

Column 7, line 45 delete "contacts, from ..." and replace with --contacts, i.e., from ...--.

Column 8, line 5 delete "(NH ..." and replace with --CVH ...--.

Column 8, line 15 delete "(NH ..." and replace with --CVH ...--.

Column 10, line 29 delete "10M, ..." and replace with --102b, ...--.

Column 10, line 41 delete "to of an ..." and replace with --to an ...--.

Column 10, line 55 delete ", 106d, 106d ..." and replace with --106c, 106d, ...--.

Column 12, line 29 delete ",102d, 102d, ..." and replace with --, 102c, 102d, ...--.

Signed and Sealed this
Thirteenth Day of October, 2015

Michelle K. Lee
*Director of the United States Patent and Trademark Office*

CERTIFICATE OF CORRECTION (continued)
U.S. Pat. No. 8,749,005 B1

In the specification

Column 12, lines 33-34 delete "field that the" and replace with --field than that of the--.

Column 13, line 46 delete "to of an ..." and replace with --to an ...--.

Column 14, line 36 delete "output signal" and replace with --output signals--.

Column 15, line 11 delete "to of an" and replace with --to an--.

Column 16, line 7 delete "which we would" and replace with --which would--.

Column 16, line 10 delete "FIG. 4 or 5." and replace with --FIGS. 4 or 5.--.

Column 17, line 37 delete "is a graph 210 is similar" and replace with --a graph 210 similar--.

Column 17, line 62 delete "FIG. 3," and replace with --FIG. 3.--.

Column 18, line 54 delete "that that" and replace with --that the--.